(12) United States Patent
Ito et al.

(10) Patent No.: US 6,893,898 B2
(45) Date of Patent: May 17, 2005

(54) SEMICONDUCTOR DEVICE AND A METHOD OF MANUFACTURING THE SAME

(75) Inventors: Fujio Ito, Hanno (JP); Hiromichi Suzuki, Tokyo (JP)

(73) Assignees: Renesas Technology Corp., Tokyo (JP); Hitachi ULSI Systems Co., Ltd., Tokyo (JP)

(*) Notice: Subject to any disclaimer, the term of this patent is extended or adjusted under 35 U.S.C. 154(b) by 0 days.

(21) Appl. No.: 10/446,787

(22) Filed: May 29, 2003

(65) Prior Publication Data

US 2003/0228720 A1 Dec. 11, 2003

(30) Foreign Application Priority Data

Jun. 7, 2002 (JP) .................................... 2002-166549

(51) Int. Cl.[7] .............................................. H01L 21/44
(52) U.S. Cl. .................. 438/108; 438/109; 438/111; 438/112; 438/123; 438/124; 257/673
(58) Field of Search ................................ 438/108, 109, 438/111, 112, 123, 124; 257/673

(56) References Cited

U.S. PATENT DOCUMENTS 6,020,649 A * 2/2000 Watanabe et al. ........... 257/796
6,410,365 B1 * 6/2002 Kawata et al. .............. 438/123

FOREIGN PATENT DOCUMENTS

| JP | 11-274195 | 10/1999 |
| JP | 11-330343 | 11/1999 |

* cited by examiner

Primary Examiner—Mary Wilczewski
Assistant Examiner—Toniae M. Thomas
(74) Attorney, Agent, or Firm—Miles & Stockbridge P.C.

(57) ABSTRACT

A semiconductor device comprising a semiconductor chip with plural electrodes arranged on a main surface thereof, plural leads electrically connected respectively to the plural electrodes on the semiconductor chip, and a resin sealing body which seals the semiconductor chip and the plural leads, wherein the plural leads include first leads and second leads adjacent to the first leads, the first leads having first external connections exposed from a mounting surface of the resin sealing body and positioned near a side face of the resin sealing body, the second leads having second external connections exposed from the mounting surface of the resin sealing body and positioned closer to the semiconductor chip with respect to the first external connections. The first and second leads are fixed to the semiconductor chip. The semiconductor device is suitable for a multi-pin structure and the manufacturing yield thereof is improved.

16 Claims, 32 Drawing Sheets

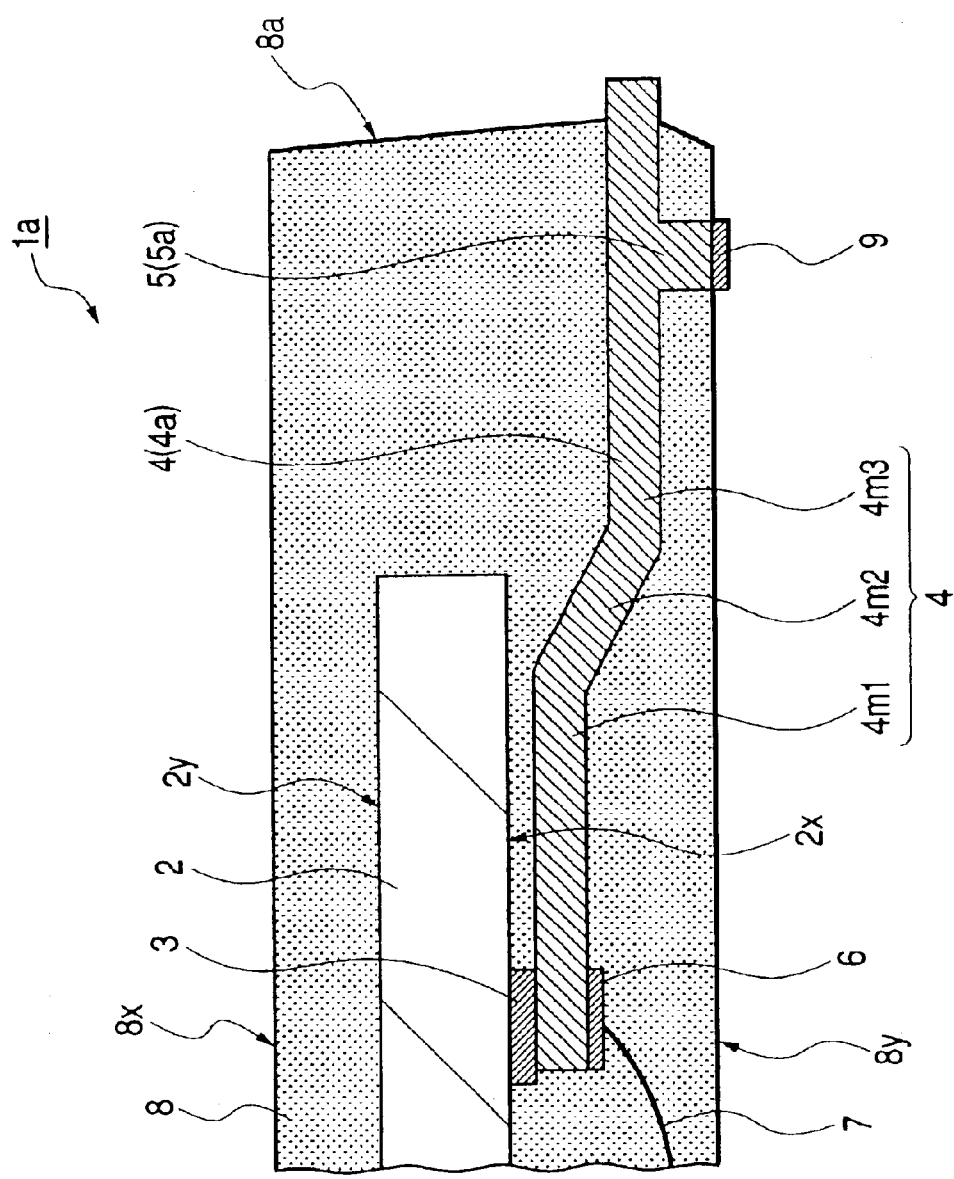

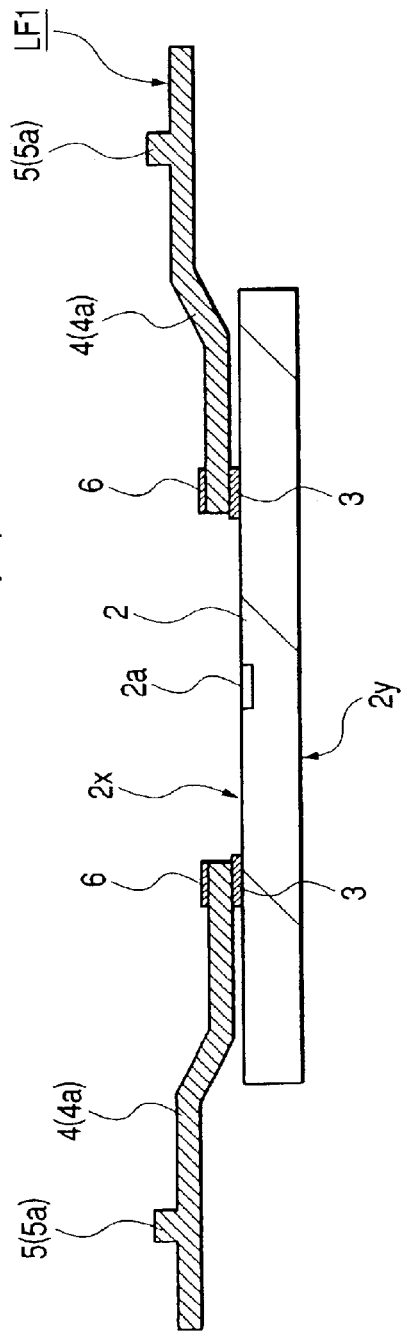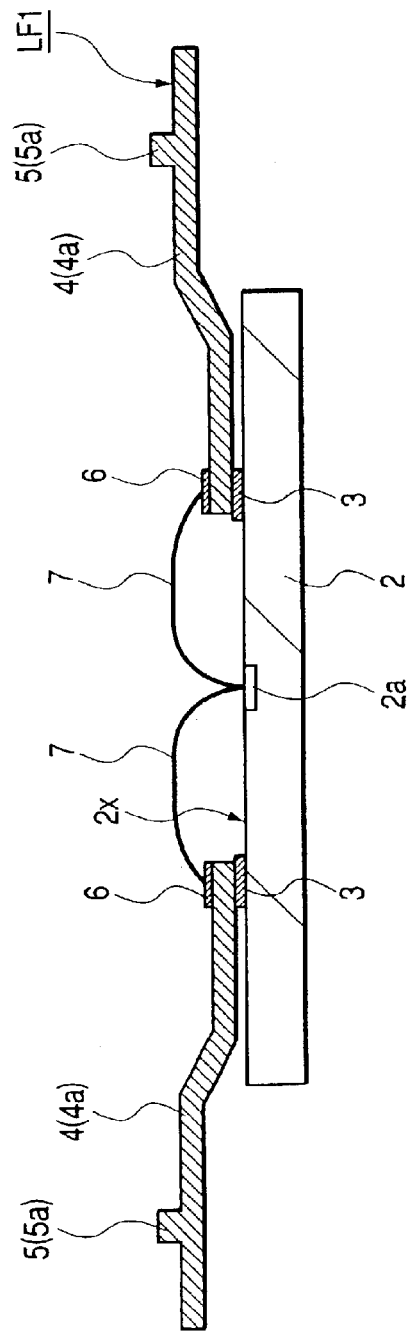

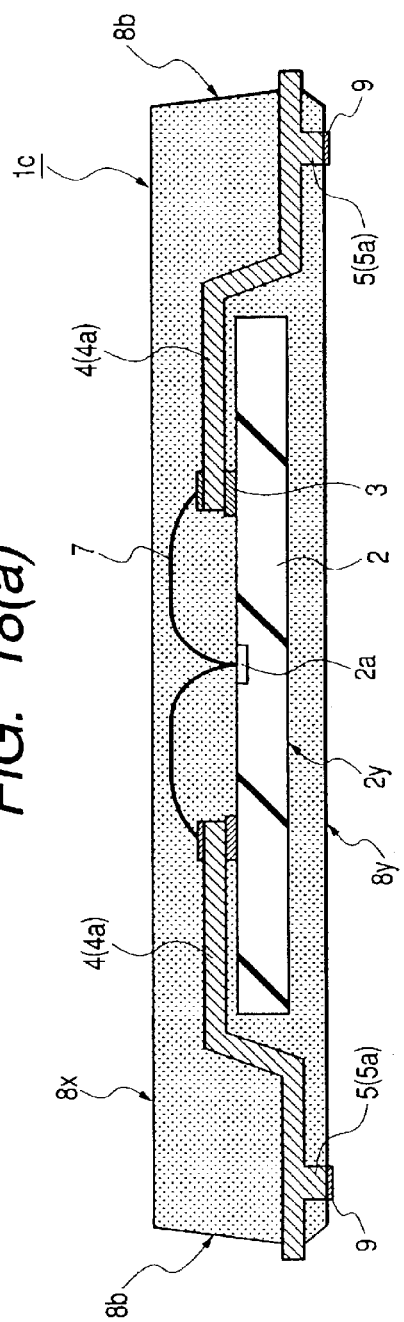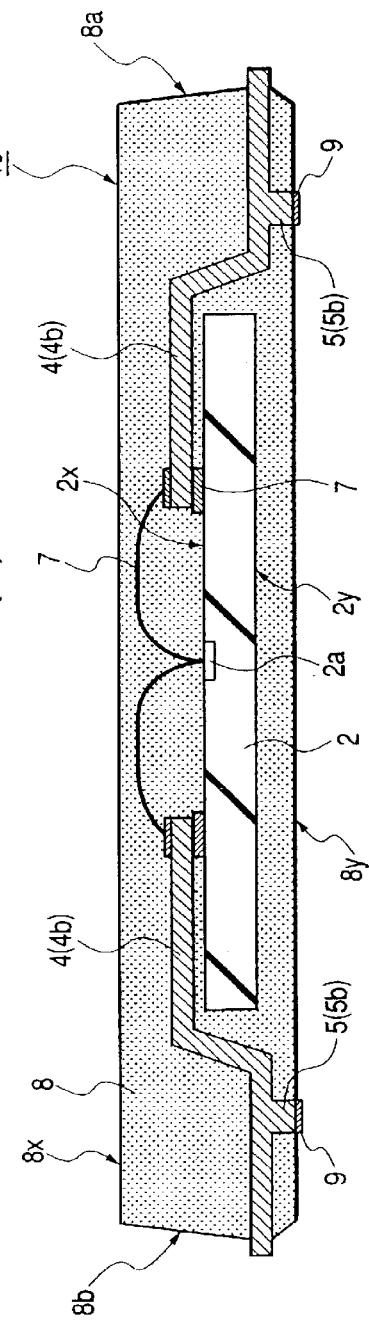

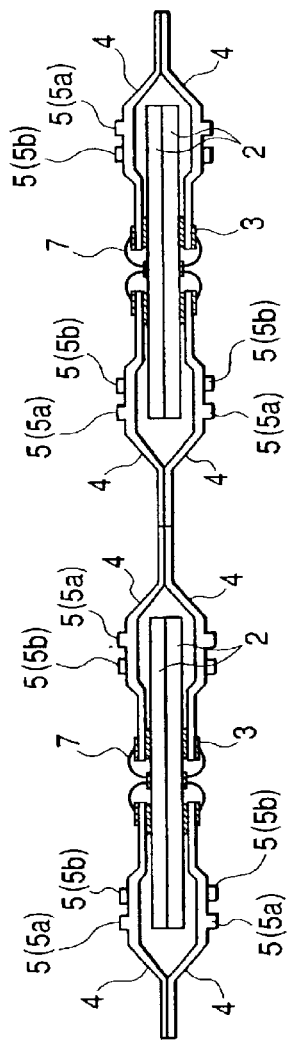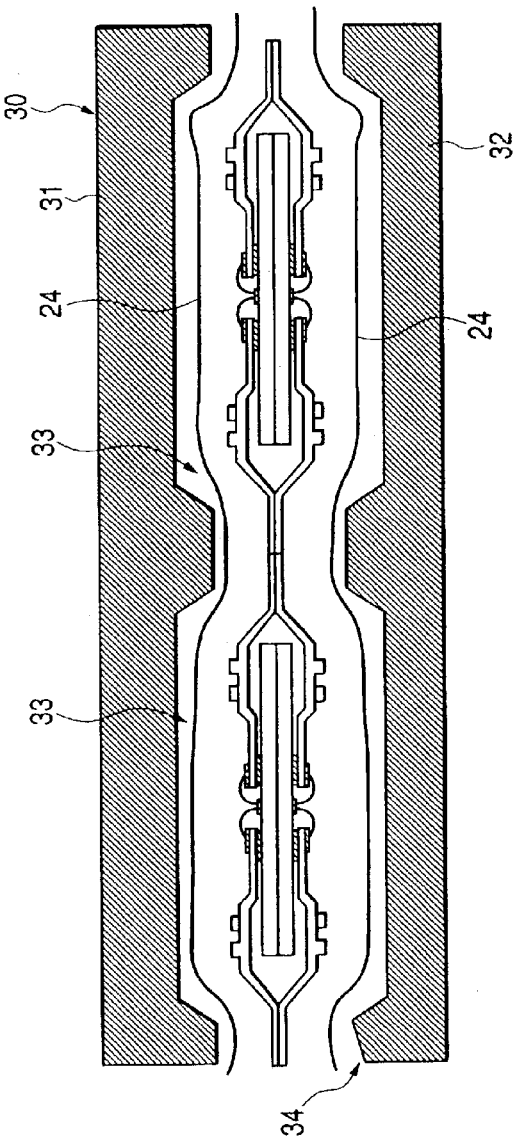
FIG. 21(a)
FIG. 21(b)

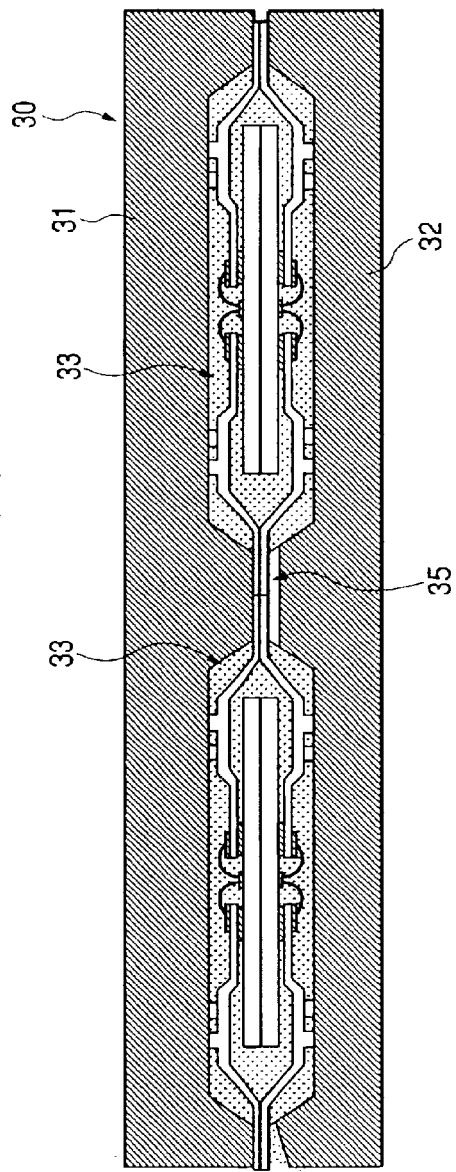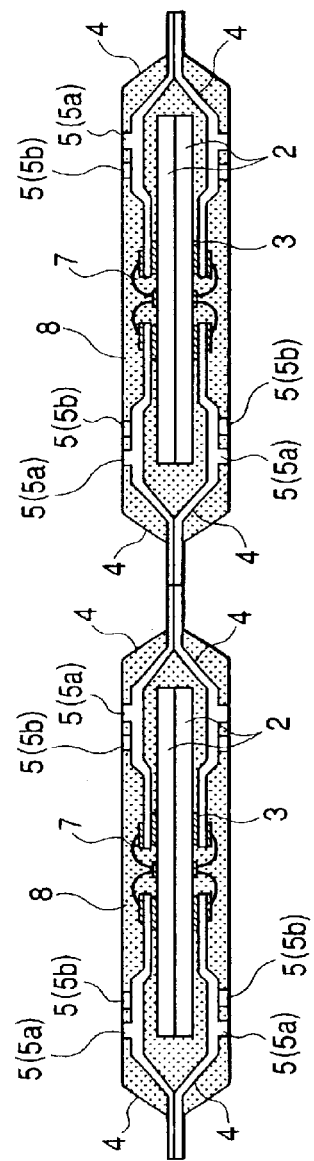

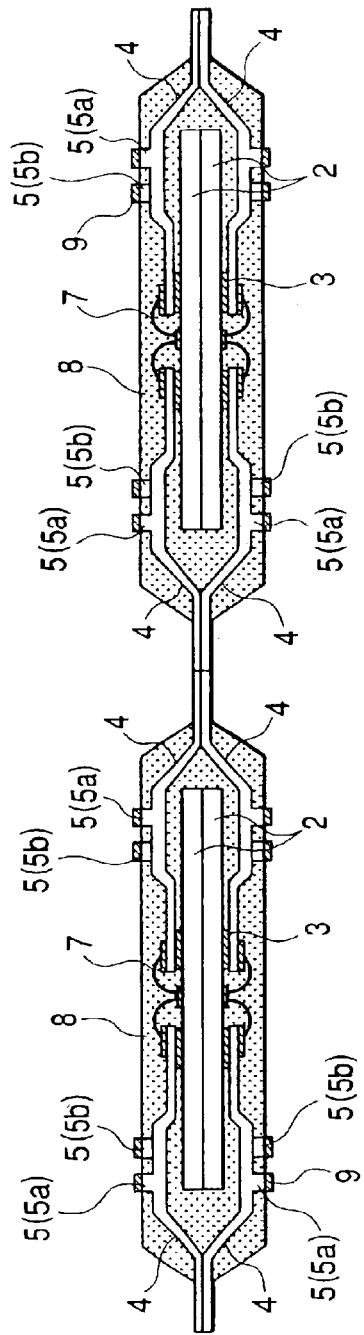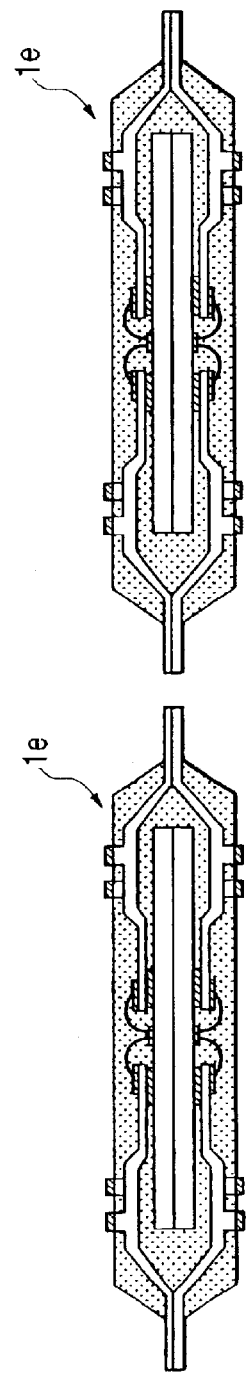

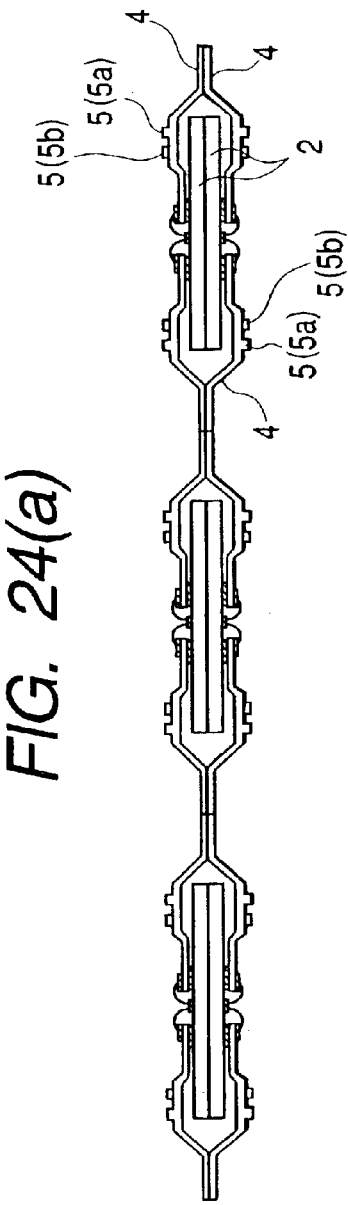
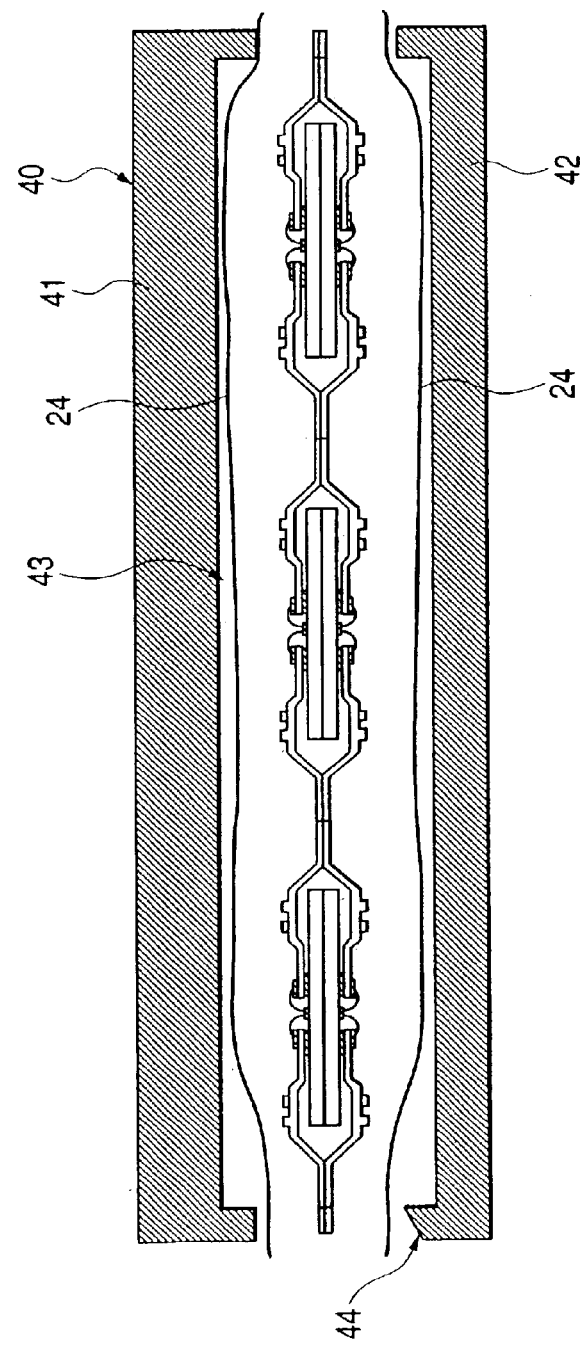
FIG. 24(a)
FIG. 24(b)

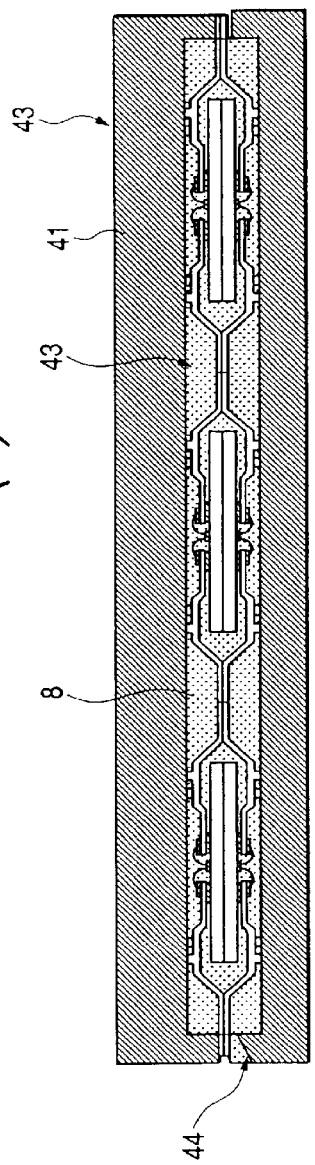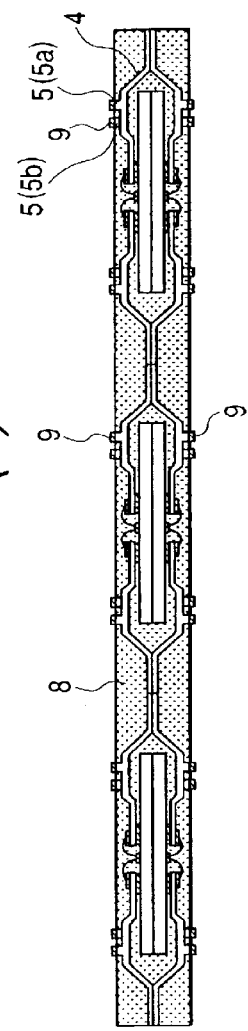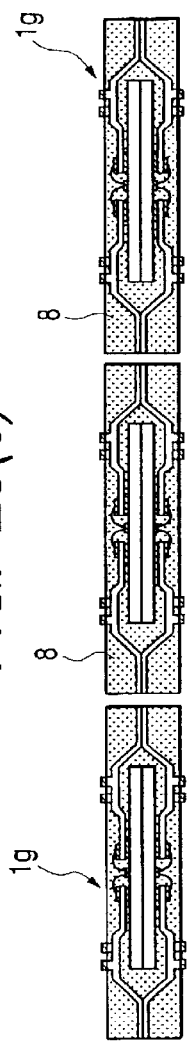

SEMICONDUCTOR DEVICE AND A METHOD OF MANUFACTURING THE SAME

BACKGROUND OF THE INVENTION

The present invention relates to a semiconductor device and a technique for manufacturing the same. Particularly, the present invention is concerned with a technique which is effectively applicable to a semiconductor device having terminals for external connection on a back surface (mounting surface) of a resin sealing member.

As semiconductor devices of the type in which a semiconductor chip is sealed with a resin sealing body, there have been proposed and practically used semiconductor devices of various package structures. For example, in Japanese Unexamined Patent Publication No. Hei 11(1999)-330343 there is disclosed a semiconductor device called QFN (Quad Flatpack Non-Leaded Package) type. The QFN type semiconductor device has a package structure wherein external connections (external terminals) formed on leads which are electrically connected to electrodes of a semiconductor chip are exposed from a back surface (mounting surface) of a resin sealing body. With this package structure, it is possible to attain the reduction of a planar size in comparison with a package structure, e.g., a semiconductor device called QFP (Quad Flatpack Package) type, wherein leads connected electrically with electrodes of a semiconductor chip are projected from side faces of a resin sealing body and are bent in a predetermined shape.

The QFN type semiconductor device is manufactured by an assembling process using a lead frame. For example, in the case of a package structure wherein a semiconductor chip is mounted on a die pad, the package structure is fabricated by mounting a semiconductor chip on a die pad (also called tab) which is supported by a frame body of a lead frame through suspension leads, then connecting electrodes on the semiconductor chip with leads electrically using bonding wires, the leads being supported by the frame body of the lead frame through tie bars (also called dam bars), thereafter sealing the semiconductor chip, leads, tie pad, suspension leads and bonding wires with a resin sealing body, and subsequently cutting off the leads, tie bars and suspension leads from the lead frame body. One ends of the bonding wires are connected to the electrodes on the semiconductor chip, while opposite ends thereof are connected to main surfaces of the leads which have the main surfaces and back surfaces opposite to the main surfaces. The main surfaces of the leads are covered with a resin sealing body and the back surfaces thereof are exposed from a back surface of the resin sealing body which has a main surface and the back surface (mounting surface) opposite to the main surface.

The resin sealing body used in the QFN type semiconductor device is formed by a transfer molding method suitable for mass production. According to the transfer molding method, the resin sealing body is formed by positioning a lead frame between an upper mold and a lower mold of a molding die so that a semiconductor chip, leads, die pad, suspension leads and bonding wires are positioned within a cavity (a resin sealing body forming portion), and thereafter injecting resin under pressure into the cavity of the molding die.

In the case of a package structure wherein external connections formed on leads are exposed from a back surface of a resin sealing body, it is fabricated by positioning a lead frame in such a manner that the external connections of the leads come into contact with a lower mold of a molding die and thereafter injecting resin under pressure into a cavity of the molding die. In this case, in the interior of the cavity, the lower mold and the external connections of the leads are not so closely in contact with each other, thus permitting easy entry of resin between the lower mold and the external connections, so that such an inconvenience as the external connections being covered with a thin film-like unnecessary resin (resin burr) is apt to occur.

To avoid the occurrence of such an inconvenience, in manufacturing a QFN type semiconductor device there is generally adopted a technique (hereinafter referred to as the "sheet molding technique") wherein a resin sheet (resin film) is interposed between a lower mold of a molding die and a lead frame, then the lead frame is positioned relative to the molding die so that external connections of leads come into contact with the resin sheet, and thereafter resin is injected under pressure into a cavity of the molding die. According to this sheet molding technique, the resin sheet and the external connections of the leads are in highly close contact with each other in the interior of the cavity, whereby the occurrence of such an inconvenience as the external connections being covered with resin burr can be suppressed. The sheet molding technique is disclosed for example in Japanese Unexamined Patent Publication No. Hei 11(1999)-274195.

SUMMARY OF THE INVENTION

In the QFN type semiconductor device, however, if an attempt is made to increase the number of terminals (a multi-pin structure) for coping with higher function and higher performance of LSI formed on a semiconductor chip, there arises the following problem.

For increasing the number of terminals it is necessary to microfabricate leads, which, however, leads to microfabrication of external connections. It is necessary for the external connections to have a predetermined area for ensuring a high mounting reliability, so the area thereof cannot be made so small. For this reason, if it is intended to obtain a multi-pin structure without changing the package size, the number of terminals cannot be increased so much and thus it is impossible to attain a high degree of multi-pin structure.

For obtaining a multi-pin structure while ensuring a predetermined area of external connections of leads and without changing the package size, it is effective to widen the external connections selectively and arrange the external connections in a zigzag fashion. In this case, however, in a molding step, the external connections positioned on the semiconductor chip side is spaced apart from a clamp portion of the molding die which clamps opposite ends of leads in the vertical direction, with the result that the adhesion between the resin sheet and the external connections of leads is deteriorated and there easily occurs such an inconvenience as the external connections being covered with resin burr. Such an inconvenience contributes to a lowering in the manufacturing yield of the semiconductor device.

It is an object of the present invention to provide a technique which permits improving the manufacturing yield of a semiconductor device suitable for a multi-pin structure.

The above and other objects and novel features of the present invention will become apparent from the following description and the accompanying drawings.

Typical modes of the present invention as disclosed herein will be outlined below.

<Means (1)>

A semiconductor device comprising:

a semiconductor chip with a plurality of electrodes arranged on a main surface thereof;

a plurality of leads electrically connected respectively to the plural electrodes on the semiconductor chip; and a resin sealing body which seals the semiconductor chip and the plural leads, wherein the plural leads include first leads and second leads adjacent to the first leads, the first leads having first external connections exposed from a mounting surface of the resin sealing body and positioned near a side face of the resin sealing body, the second leads having second external connections exposed from the mounting surface of the resin sealing body and positioned closer to the semiconductor chip with respect to the first external connections, the first and second leads being fixed to the semiconductor chip.

<Means (2)>

A method of manufacturing a semiconductor device, comprising the steps of:

providing a lead frame, the lead frame having first and second leads adjacent to each other, further having first external connections formed on the first leads and second external connections formed on the second leads and positioned on one end side of the leads with respect to the first external connections, and providing a molding die having a first mold and a second mold, the first mold having on a first mating surface a first clamp portion and a cavity contiguous to the first clamp portion, the second mold having a second clamp portion opposed to the first clamp portion on a second mating surface opposed to the first mating surface;

fixing one end portions of the first and second leads to a semiconductor chip;

connecting a plurality of electrodes arranged on a main surface of the semiconductor chip electrically to the first and second leads respectively; and sandwiching opposite end portions opposite to the first end portions of the first and second leads by the first and second clamp portions and injecting resin into the cavity while allowing the first and second connections to be in contact with a resin sheet disposed between the first and second leads and the second mating surface, to seal the semiconductor chip and the first and second leads with the resin.

BRIEF DESCRIPTION OF THE DRAWINGS

FIGS. 5(a) and 5(b) are sectional views showing an internal structure of the semiconductor device of the first embodiment, in which FIG. 5(a) is a sectional view taken along line A—A in FIG. 3 and FIG. 5(b) is a sectional view taken along line B—B in FIG. 3;

FIG. 6 is a partially enlarged view of FIG. 5(a);

FIGS. 9(a) and 9(b) are sectional views showing a part of the lead frame used in manufacturing the semiconductor device of the first embodiment, in which FIG. 9(a) is a sectional view taken along a first lead and FIG. 9(b) is a sectional view taken along a second lead;

FIGS. 10(a) and 10(b) are sectional views showing manufacturing steps in a manufacturing process for the semiconductor device of the first embodiment, in which FIG. 10(a) is a sectional view showing a die bonding step and FIG. 10(b) is a sectional view showing a wire bonding step;

FIGS. 15(a) and 15(b) are sectional views of a semiconductor device according to a second embodiment of the present invention, in which FIG. 15(a) is a sectional view taken along a first lead and FIG. 15(b) is a sectional view taken along a second lead;

FIGS. 18(a) and 18(b) are sectional views of a semiconductor device according to a third embodiment of the present invention, in which FIG. 18(a) is a sectional view taken along a first lead and FIG. 18(b) is a sectional view taken along a second lead;

FIGS. 21(a) and 21(b) are sectional views showing manufacturing steps included in a manufacturing process for a semiconductor device according to a fifth embodiment of the present invention;

FIGS. 22(a) and 22(b) are sectional views showing manufacturing steps included in the manufacturing process for the semiconductor device of the fifth embodiment;

FIGS. 23(a) and 23(b) are sectional views showing manufacturing steps included in the manufacturing process for the semiconductor device of the fifth embodiment;

FIGS. 24(a) and 24(b) are sectional views showing manufacturing steps included in a manufacturing process for a semiconductor device according to a sixth embodiment of the present invention;

FIG. 25(a), 25(b), and 25(c) are sectional views showing manufacturing steps included in the manufacturing process for the semiconductor device of the sixth embodiment;

DETAILED DESCRIPTION OF PREFERRED EMBODIMENTS

Figure 1:
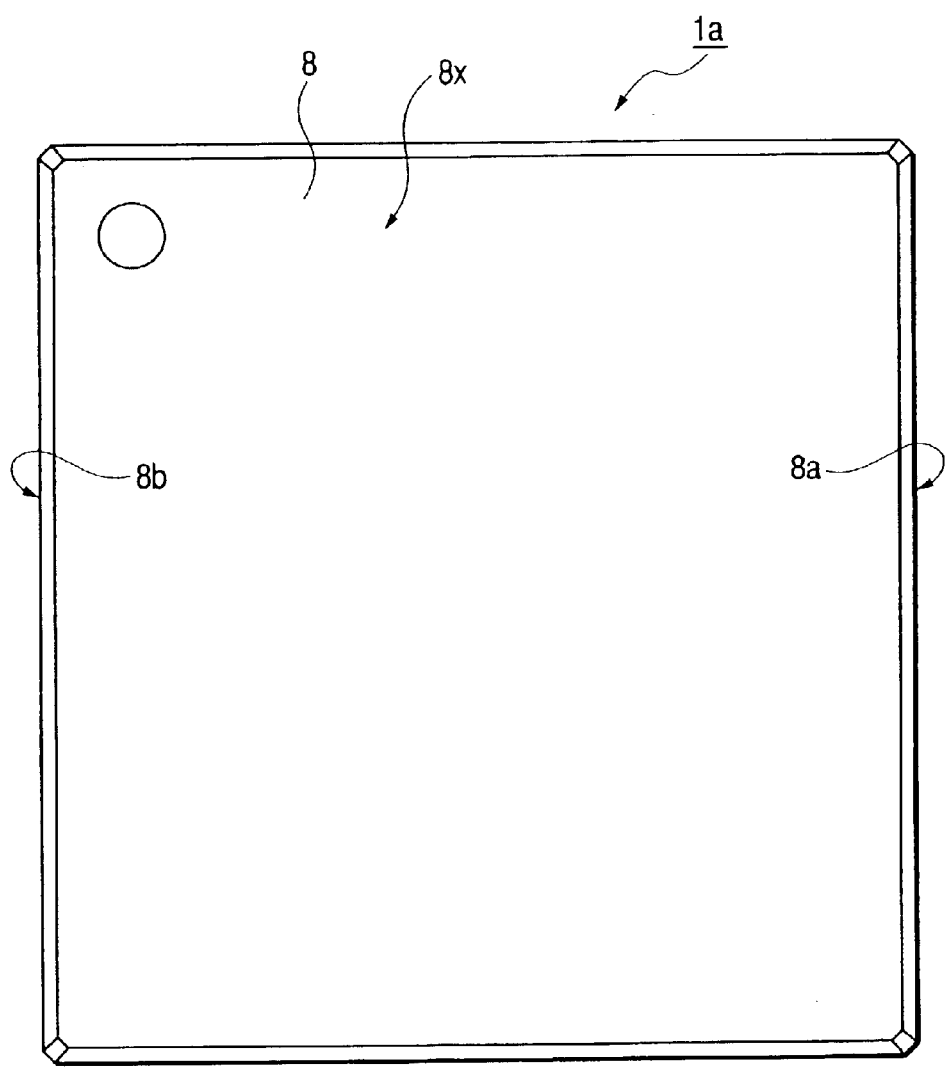
FIG. 1 is a plan view showing an appearance (main surface side) of a semiconductor device according to a first embodiment of the present invention.

Embodiments of the present invention will be described in detail hereinunder with reference to the accompanying drawings. In all of the drawings for illustrating the embodiments, components having the same functions are identified by like reference numerals, and repeated explanations thereof will be omitted.

(First Embodiment)

In this first embodiment reference will be made to an example of application of the present invention to a SON (Small Out-line Non-Leaded Package) type semiconductor device.

Figure 2:
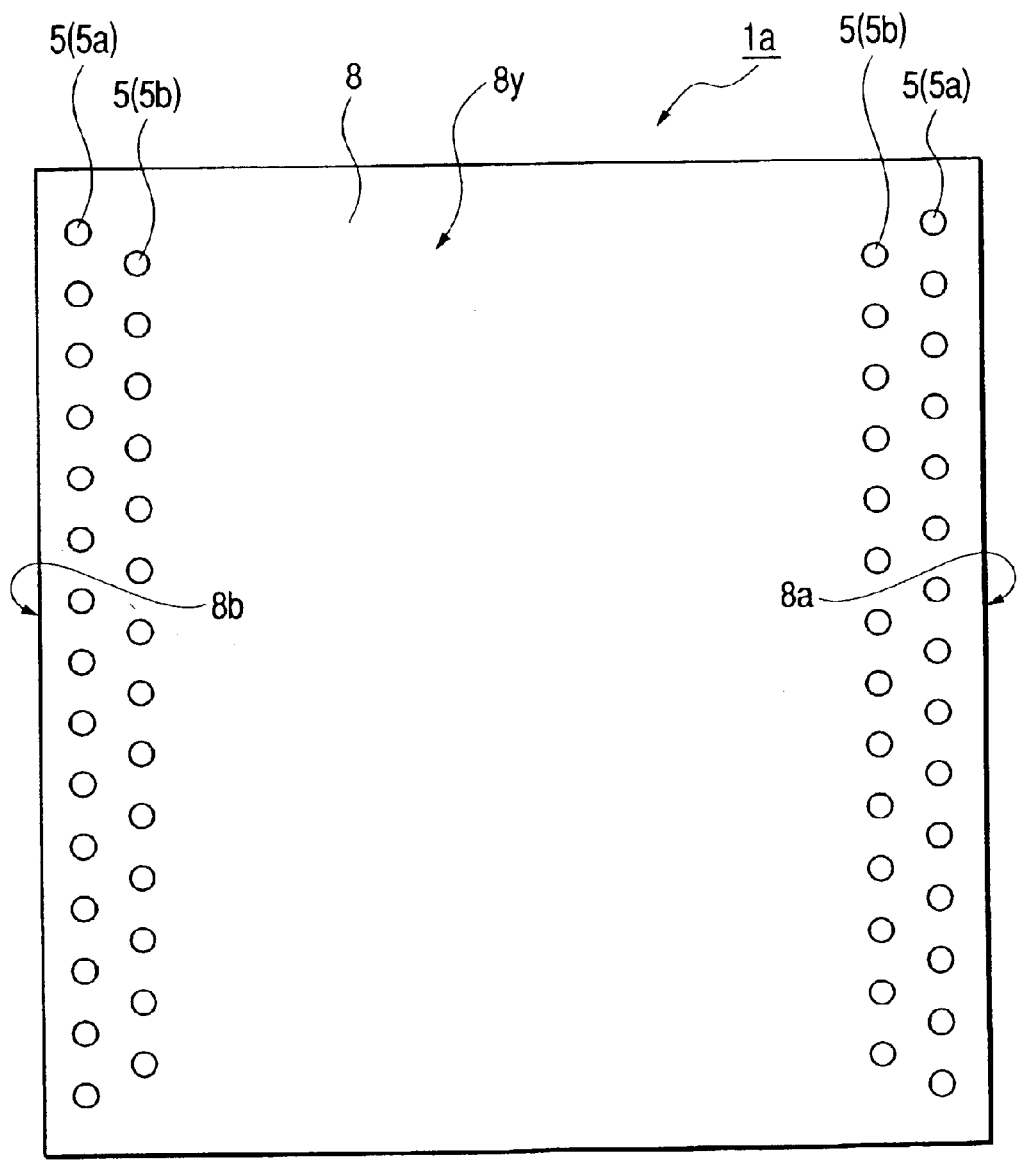
FIG. 2 is a plan view (bottom view) showing an appearance (back side) of the semiconductor device of the first embodiment.
Figure 3:
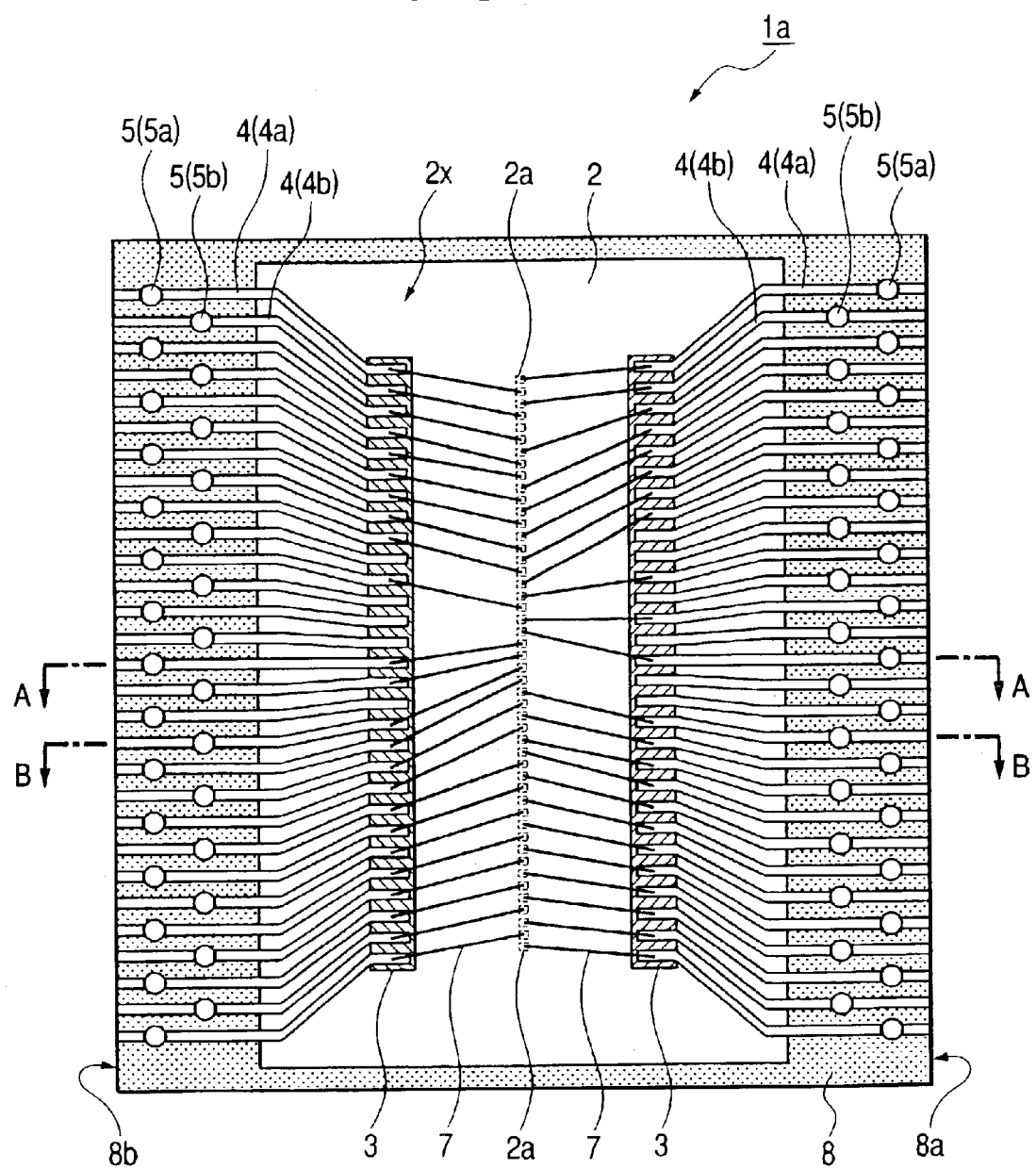
FIG. 3 is a plan view showing an internal structure (back side) of the semiconductor device of the first embodiment.
Figure 4:
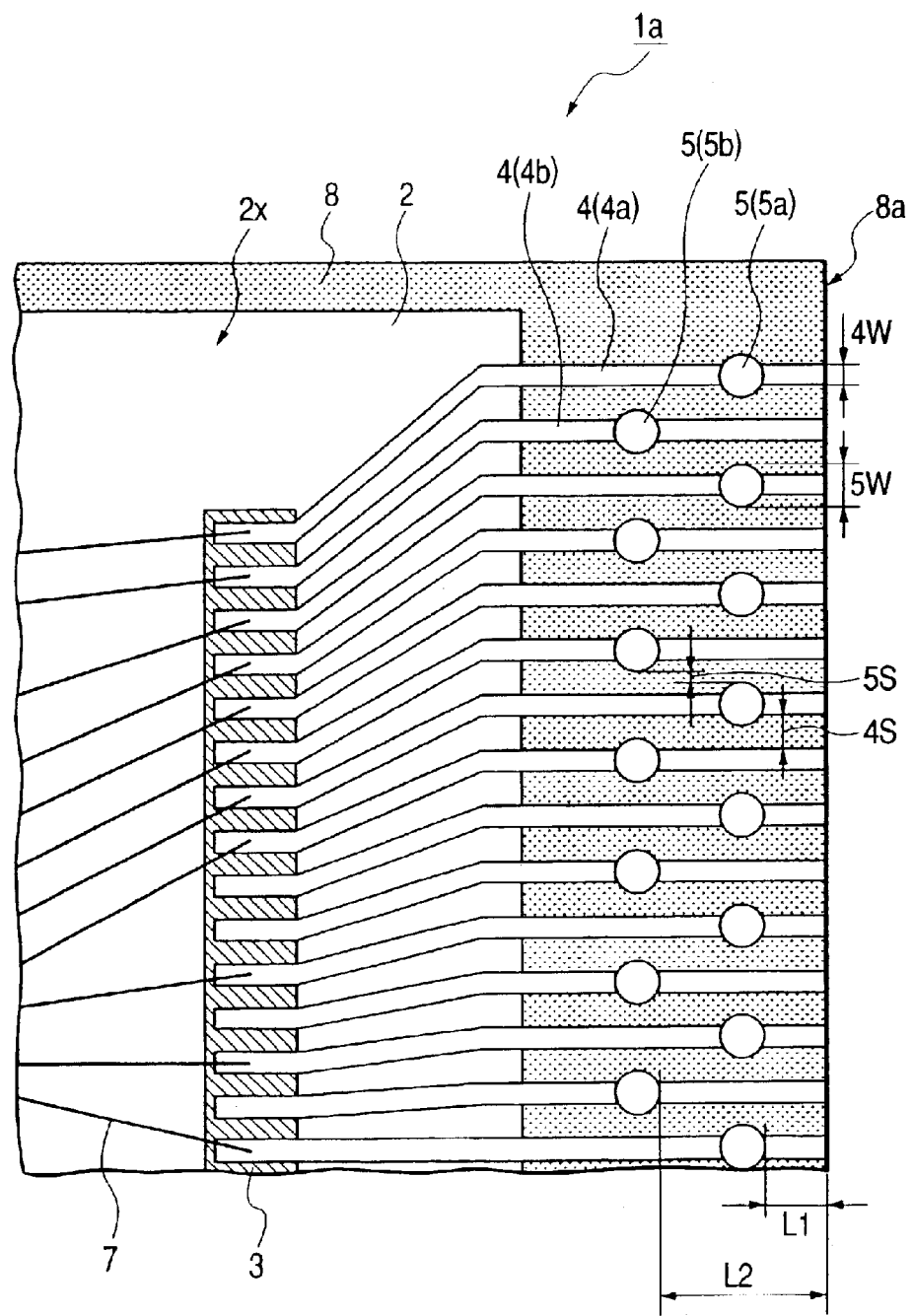
FIG. 4 is a partially enlarged sectional view of FIG. 3.
Figure 5A:
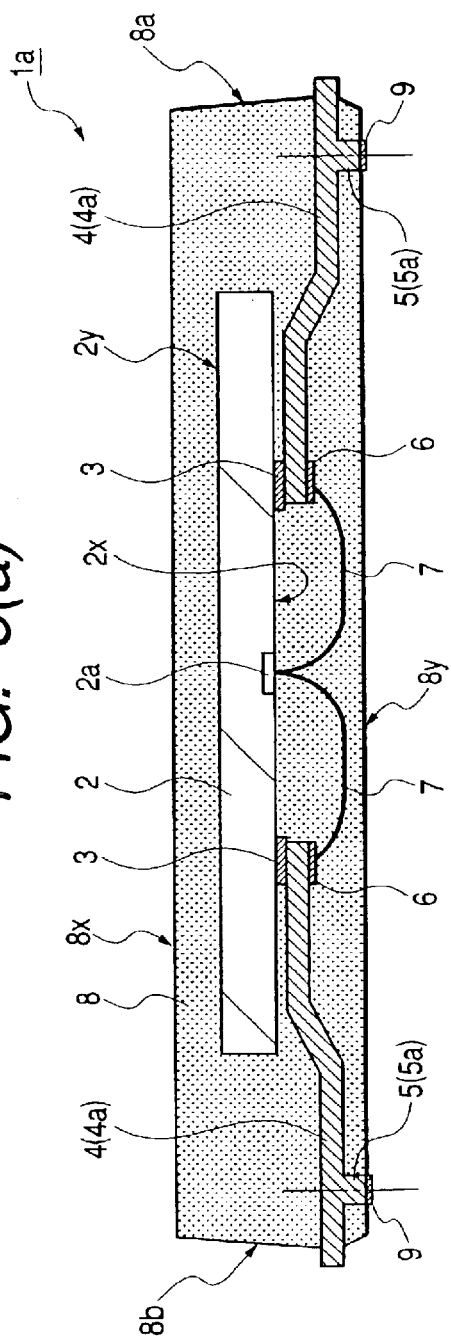
Figure 5B:
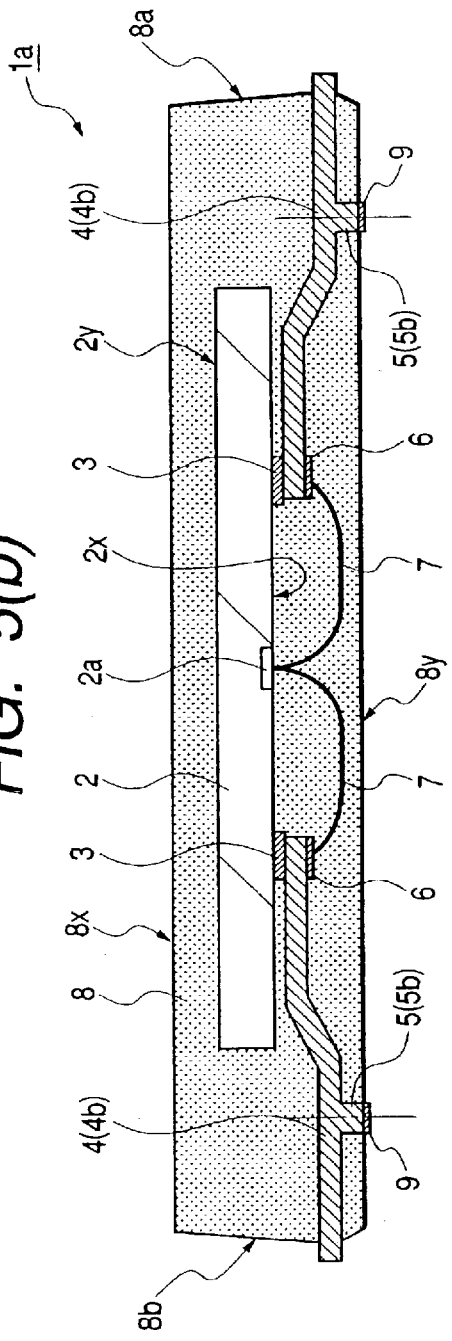

FIG. 1 is a plan view showing an appearance (main surface side) of a semiconductor device according to a first embodiment of the present invention;

FIG. 2 is a plan view (bottom view) showing an appearance (back side) of the semiconductor device of the first embodiment;

FIG. 3 is a plan view showing an internal structure (back side) of the semiconductor device of the first embodiment;

FIG. 4 is a partially enlarged sectional view of FIG. 3;

FIGS. 5(a) and 5(b) are sectional views showing an internal structure of the semiconductor device of the first embodiment, in which FIG. 5(a) is a sectional view taken along line A—A in FIG. 3 and FIG. 5(b) is a sectional view taken along line B—B in FIG. 3; and FIG. 6 is a partially enlarged sectional view of FIG. 5(a).

As shown in FIGS. 1 to 5(b), the semiconductor device of this embodiment, indicated at 1a, is of a package structure having a single semiconductor chip 2, first and second lead groups each comprising plural leads 4, plural bonding wires 7, and a resin sealing body 8. The semiconductor chip 2, the leads 4 of the first and second lead groups, and the plural bonding wires 7 are sealed by the resin sealing body 8.

As shown in FIGS. 3 and 5, the semiconductor chip 2 is quadrangular in a plane shape thereof intersecting its thickness direction. In this embodiment, it is rectangular in plan. The semiconductor chip 2 is mainly composed of a semiconductor substrate, plural transistors formed on a main surface of the semiconductor substrate, a multi-layer interconnection constituted by a plural-stage stack of insulating layers and wiring layers on the main surface of the semiconductor substrate, and a surface protective film (final protective film) which is formed so as to cover the multi-layer interconnection, although no limitation is made to this construction. For example, the insulating layer is formed by a silicon oxide film, the wiring layer is formed by such a metallic film as an aluminum (Al), aluminum alloy, copper (Cu), or copper alloy film, and the surface protective film is formed by a multi-layer film which is constituted by a stack of an inorganic insulating film such as silicon oxide film or silicon nitride film and an organic insulating film.

The semiconductor chip 2 has a main surface (circuit-forming surface) 2x and a back surface 2y which are positioned opposite to each other. On the main surface 2x side of the semiconductor chip 2 is formed a memory circuit constituted, for example, by DRAM (Dynamic Random Access Memory) as an integrated circuit. The memory circuit is mainly composed of transistors formed on the main surface of the semiconductor substrate and wiring lines formed in the multi-layer interconnection.

Plural electrodes 2a are arranged on the main surface 2x of the semiconductor chip 2. The plural electrodes 2a are arranged centrally along one center line (in this embodiment a center line extending in the same direction as the long sides of the semiconductor chip 2) out of two center lines on the main surface 2x of the semiconductor chip 2. The plural electrode pads 2a are formed in the top wiring layer of the multi-layer interconnection of the semiconductor chip 2 and are exposed through bonding apertures formed in the surface protective film of the semiconductor chip 2 correspondingly to the electrodes 2a.

As shown in FIGS. 1, 2, and 5, the resin sealing body 8 is quadrangular in a plane shape thereof intersecting its thickness direction. It is rectangular in this embodiment. The resin sealing body 8 has a main surface 8x and a back surface (mounting surface) 8y which are positioned opposite to each other. A plane size of the resin sealing body 8 is larger than that of the semiconductor chip 2.

For attaining a decrease of stress, the resin sealing body 8 is formed of, for example, a biphenyl-based resin with a phenolic curing agent, silicone rubber and filler incorporated therein. The resin sealing body 8 is formed by a transfer molding method which is suitable for mass production. According to the transfer molding method, there is used a molding die having pot, runner, injection gate, and cavity, and resin is injected under pressure into the cavity from the pot through the runner and injection gate. In this embodiment there is adopted a sheet molding technique which uses a resin sheet to form the resin sealing body 8.

As shown in FIGS. 3 to 5, the leads 4 of the first lead group are arranged along one of the two opposite long sides of the semiconductor chip 2, while the leads of the second lead group are arranged along the other long side of the semiconductor chip 2. One long side of the semiconductor chip 2 is positioned on the same side as one side face 8b out of two opposite side faces (8a, 8b) of the resin sealing body 8, while the other long side of the semiconductor chip 2 is positioned on the same side as the other side face 8a of the resin sealing body 8.

The leads 4 of the first lead group extend across an outer periphery edge of the main surface 2x of the semiconductor chip 2 and one ends thereof are fixed to the semiconductor chip 2, while their opposite ends are located on the one side faces 8*a* side of the resin sealing body 8. The leads 4 of the second lead group extend across an outer periphery edge of the main surface 2*x* of the semiconductor chip 2 and one ends thereof are fixed to the semiconductor chip 2, while their opposite ends are located on the other side faces 8*b* side of the resin sealing body 8. In this embodiment, one ends of the leads 4 of the first and second lead groups are arranged in the layout direction of the plural electrodes 2*a* and are fixed to the main surface 2*x* of the semiconductor chip 2 through an insulating resin tape 3. The opposite ends of the leads 4 of the first and second lead groups are arranged in the longitudinal direction (in the same direction as the long sides of the semiconductor chip) of the side faces (8*a*, 8*b*) of the resin sealing body 8.

The plural electrodes 2*a* of the semiconductor chip 2 are electrically connected respectively to the leads 4 of the first and second lead groups. In this embodiment, the electric connection between the electrodes 2*a* of the semiconductor chip 2 and the leads 4 is carried out using bonding wires 7. One ends of the bonding wires 7 are connected to the electrodes 2*a* of the semiconductor chip 2 and opposite ends thereof are connected to one ends of the leads 4. As the bonding wires 7 there are used gold (Au) wires for example. For connection of the wires 7 there is adopted, for example, a nail head bonding (ball bonding) method which utilizes ultrasonic vibration in combination with thermocompression bonding.

In the first and second lead groups, the plural leads 4 include first leads 4*a* and second leads 4*b* which are alternately adjacent to each other. The first leads 4*a* are exposed from the back surface 8*y* of the resin sealing body 8 and have first external connections 5*a* positioned near side faces of the resin sealing body 8. The second leads 4*b* are exposed from the back surface 8*y* of the resin sealing body 8 and have second external connections 5*b* positioned on the semiconductor chip 2 side, in other words, on one end sides of the leads 4, relative to the first external connections 5*a*. The first leads 4*a* and the second leads 4*b* are arranged alternately in the longitudinal direction of the resin sealing body 8 (in the longitudinal direction of the semiconductor chip). That is, in the first and second lead groups, the first leads 4*a* having the first external connections 5*a* and the second leads 4*b* having the second external connections 5*b* are arranged alternately in one direction.

On the back surface 8*y* of the resin sealing body 8, as shown in FIG. 2, there are arranged first and second terminal groups comprising plural external connections 5. The external connections 5 of the first terminal group are arranged in the longitudinal direction of the resin sealing body 8 near the first side face 8*a* of the resin sealing body, while the external connections 5 of the second terminal group are arranged in the longitudinal direction of the resin sealing body 8 near the second side face 8*b* of the resin sealing body. In the first and second terminal groups, the plural external connections 5 include the first external connections 5*a* positioned near side faces (8*a*, 8*b*) of the resin sealing body 8 and the second external connections 5*b* positioned away from the side faces of the resin sealing body 8 relative to the first external connections 5*a*. The first and second external connections (5*a*, 5*b*) are arranged alternately in the longitudinal direction of the resin sealing body 8 (in the longitudinal direction of the semiconductor chip). Thus, in the first and second terminal groups, the first external connections 5*a* and the second external connections 5*b* are arranged zigzag in one direction.

As shown in FIG. 6, each of the plural leads 4 (4*a*, 4*b*) comprises a first portion 4*m*1 extending on the main surface 2*x* of the semiconductor chip 2, a second portion 4*m*2 which is bent from the first portion 4*m*1 toward the back surface 8*y* of the resin sealing body 8, and a third portion 4*m*3 which extends from the second portion 4*m*2 toward a side face of the resin sealing body 8.

As shown in FIGS. 3 to 5, the first and second external connections (5*a*, 5*b*) are formed on the third portions 4*m*3 of the first and second leads (4*a*, 4*b*) at positions outside the semiconductor chip 2.

As shown in FIGS. 5 and 6, the external connections (5*a*, 5*b*) are integral with the leads (4*a*, 4*b*) and are thicker than the third portions 4*m*3 of the leads 4. In this embodiment, for example, the thickness of each external connection 5 is about 125 $\mu$m to 150 $\mu$m and the thickness of each lead 4 at the other lead portion than the associated external connection 5 is about 65 $\mu$m to 75 $\mu$m.

Though not shown in detail, the external connections 5 project outward from the back surface 8*y* of the resin sealing body 8 and their projecting ends are covered with a solder layer (plating layer) 9 which is formed by a plating method or a printing method. The semiconductor device 1*a* of this embodiment is mounted by soldering the external connections 5 to electrodes (foot print, lands, and pads) formed on a wiring substrate.

As shown in FIG. 4, the width 5W of each of the external connections (5*a*, 5*b*) 5 is larger than the width 4W of the third portion 4*m*3 of each of the leads (4*a*, 4*b*) 4. The spacing 5S between each of the first connections 5*a* and each of the second external connections 5*b* is smaller than the spacing 4S between the third portion 4*m*3 of each of the first leads 4*a* and the third portion 4*m*3 of each of the second leads 4*b*. The distance L2 from a side face (8*a*, 8*b*) of the resin sealing body 8 to each of the second external connections 5*b* is longer than the distance LI from the side face (8*a*, 8*b*) of the resin sealing body to each of the first external connections 5*a*. In this embodiment, for example, the width 5W is about 300 $\mu$m, the width 4W is about 200 $\mu$m, the spacing 5S is about 100 $\mu$m, the spacing 4S is about 300 $\mu$m, the distance L2 is about 0.8 mm, and the distance L1 is about 0.1 mm.

The semiconductor device 1*a* of this embodiment is of a package structure wherein the plural external connections 5 exposed from the back surface 8*y* of the resin sealing body 8 are arranged zigzag in the longitudinal direction of the resin sealing body. According to such a package structure it is possible to microfabricate the leads 4 while ensuring such an area of the external connections 5 as is necessary for obtaining a high mounting reliability, and hence possible to attain a multi-pin structure without changing the package size.

Figure 7:
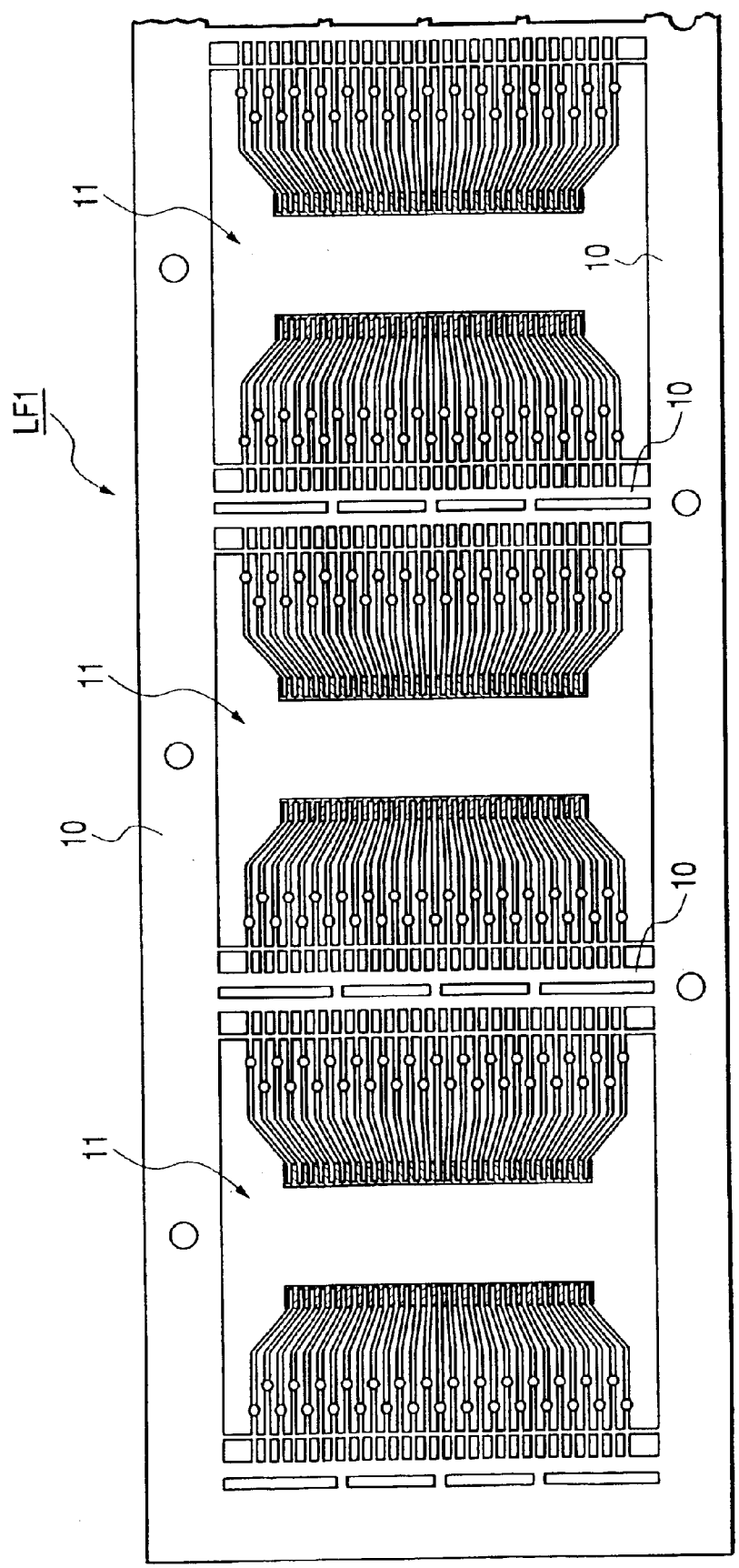
FIG. 7 is a plan view showing a part of a lead frame used in manufacturing the semiconductor device of the first embodiment.
Figure 8:
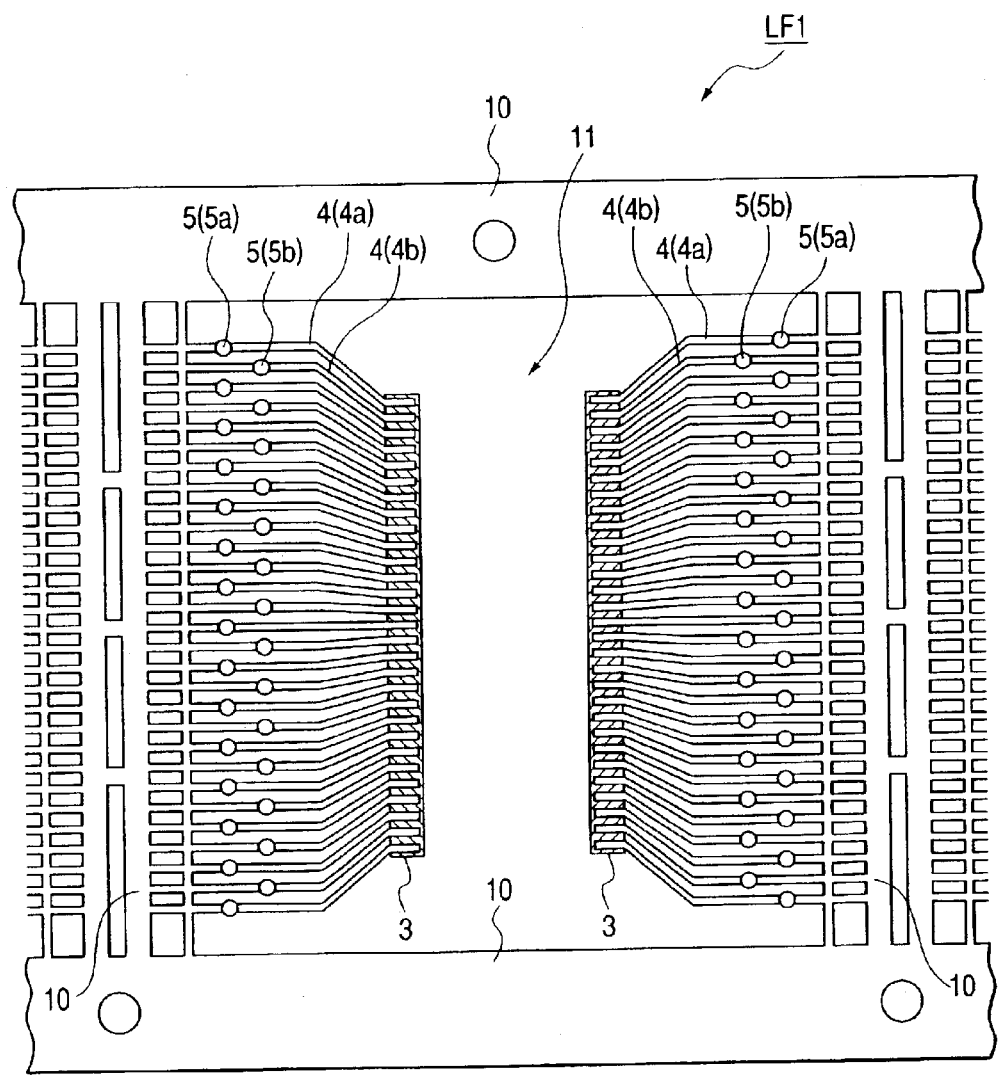
FIG. 8 is a partially enlarged plan view of FIG. 7.
Figure 9A:
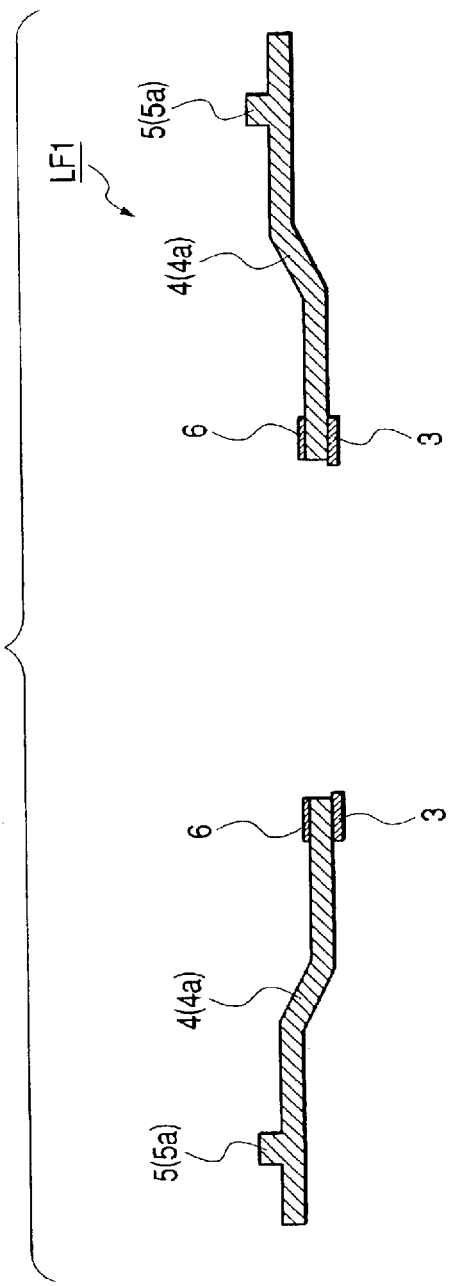
Figure 9B:
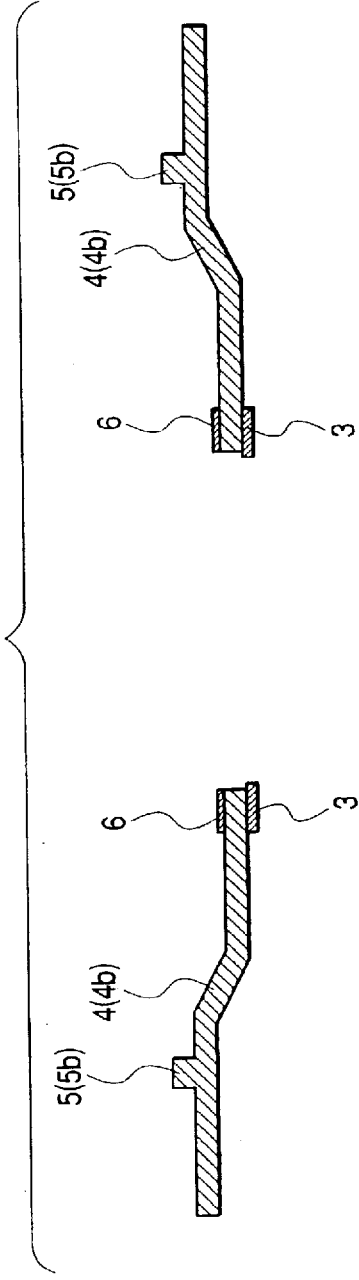

Next, with reference to FIGS. 7 to 9(*b*), the following description is now provided about a lead frame which is used in fabricating the semiconductor device 1*a*.

FIG. 7 is a plan view showing a part of a lead frame;

FIG. 8 is a partially enlarged plan view of FIG. 7; and

FIGS. 9(*a*) and 9(*b*) are sectional views showing a part of the lead frame, in which FIG. 9(*a*) is a sectional view taken along a first lead and FIG. 9(*b*) is a sectional view taken along a second lead.

As shown in FIG. 7, a lead frame LF1 is of a multi-frame structure in which plural product-forming areas 11 partitioned by a frame body 10 are arranged longitudinally of the lead frame LF1. In each of the product-forming areas 11, as shown in FIGS. 8, 9(*a*),and 9(*b*), there are arranged first and second lead groups each comprising plural leads 4 including first and second leads (4*a*, 4*b*). In this embodiment, the product-forming areas 11 are each rectangular in plan. The first and second lead groups are opposed to and spaced from each other in a short-side direction of each product-forming area 11. The leads 4 of the first and second lead groups are arranged in a long-side direction of each product-forming area 11. In the first and second lead groups, adjacent leads 4 are interconnected through a tie bar 12. A plating layer 6 is formed on a bonding face located on one end side of each of the plural leads 4, while an insulating tape 3 is affixed to the side opposite to the bonding face, the insulating tape 3 extending in the long-side direction of each product-forming area 11. The opposite ends of the plural leads 4 are connected to the lead frame 10.

For fabricating the lead frame LF1, first a metallic plate of, for example, Cu, Cu alloy, or Fe—Ni alloy having a thickness of 125~150 μm is provided and one side thereof is covered with a photo-resist film at the area where leads 4 are to be formed. At the area where external connections 5 are to be formed, both sides of the metallic plate are coated with the photo-resist film. In this state, the metallic plate is etched (half-etching) using a medical fluid to thin the metallic plate to, for example, about half (65~75 μm) at the area where one side is coated with the photo-resist film. By carrying out etching in accordance with such a method, the metallic plate vanishes completely at the areas where both sides are not coated with the photo-resist film, while leads 4 having a thickness of about 65~75 μm are formed at the area where one side is coated with the photo-resist film. As to the metallic plate of the area where both sides are coated with the photo-resist film, it is not etched with the medical fluid, so that there are formed projecting external connections 5 having the same thickness (125~150 μm) as that before etching.

Next, the photo-resist film is removed, then a plating layer 6 is formed on the bonding face located on one end side of each lead 4, and thereafter the leads 4 are subjected to bending, whereby the lead frame LF1 shown in FIGS. 7 to 9(b) is completed.

Next, with reference to FIGS. 11 to 14, a description will be given below about a molding die which is used in fabricating the semiconductor device 1a.

Figure 11:
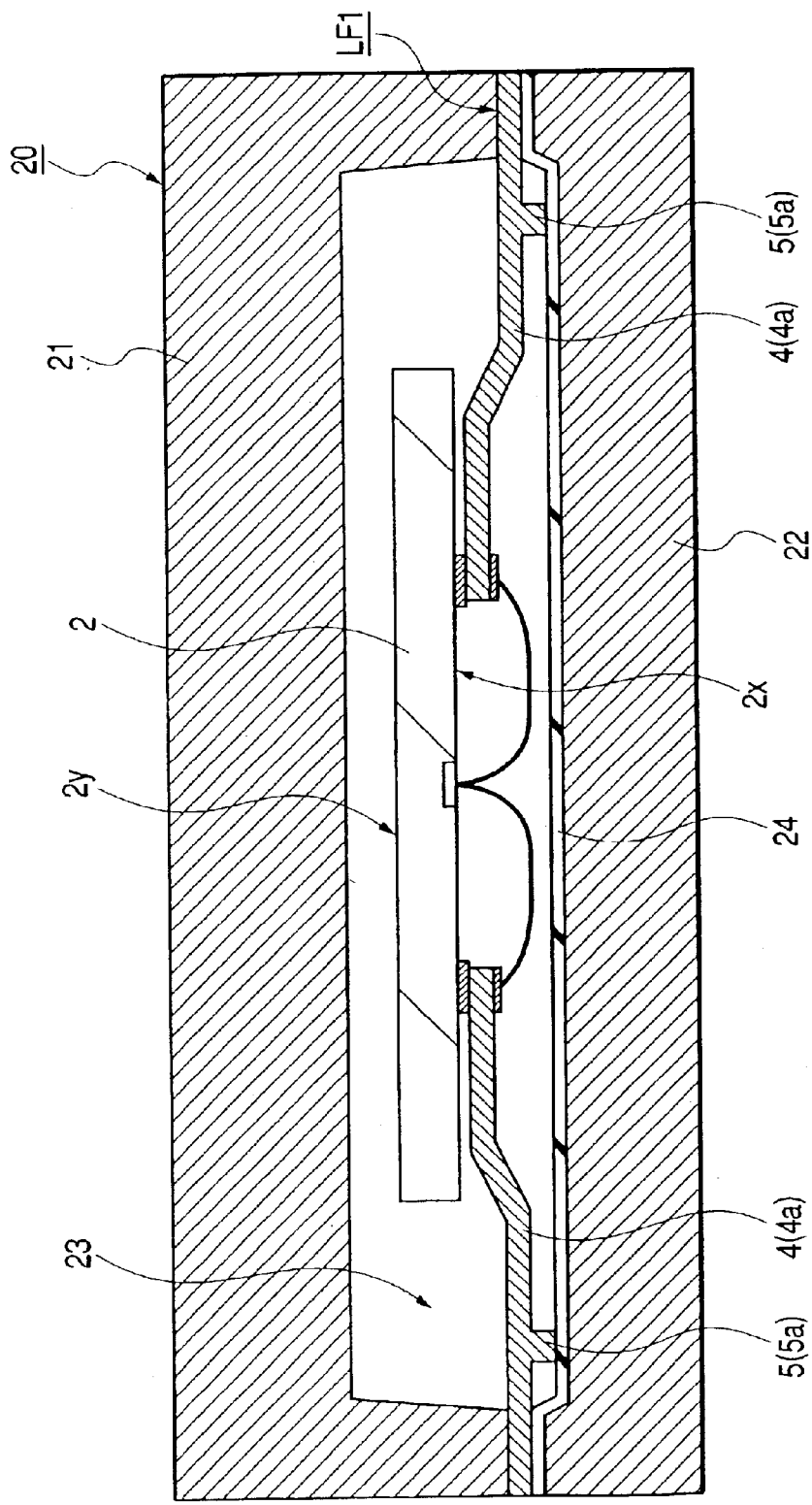
FIG. 11 is a sectional view taken along the first lead in a molding step included in the manufacturing process for the semiconductor device of the first embodiment.
Figure 12:
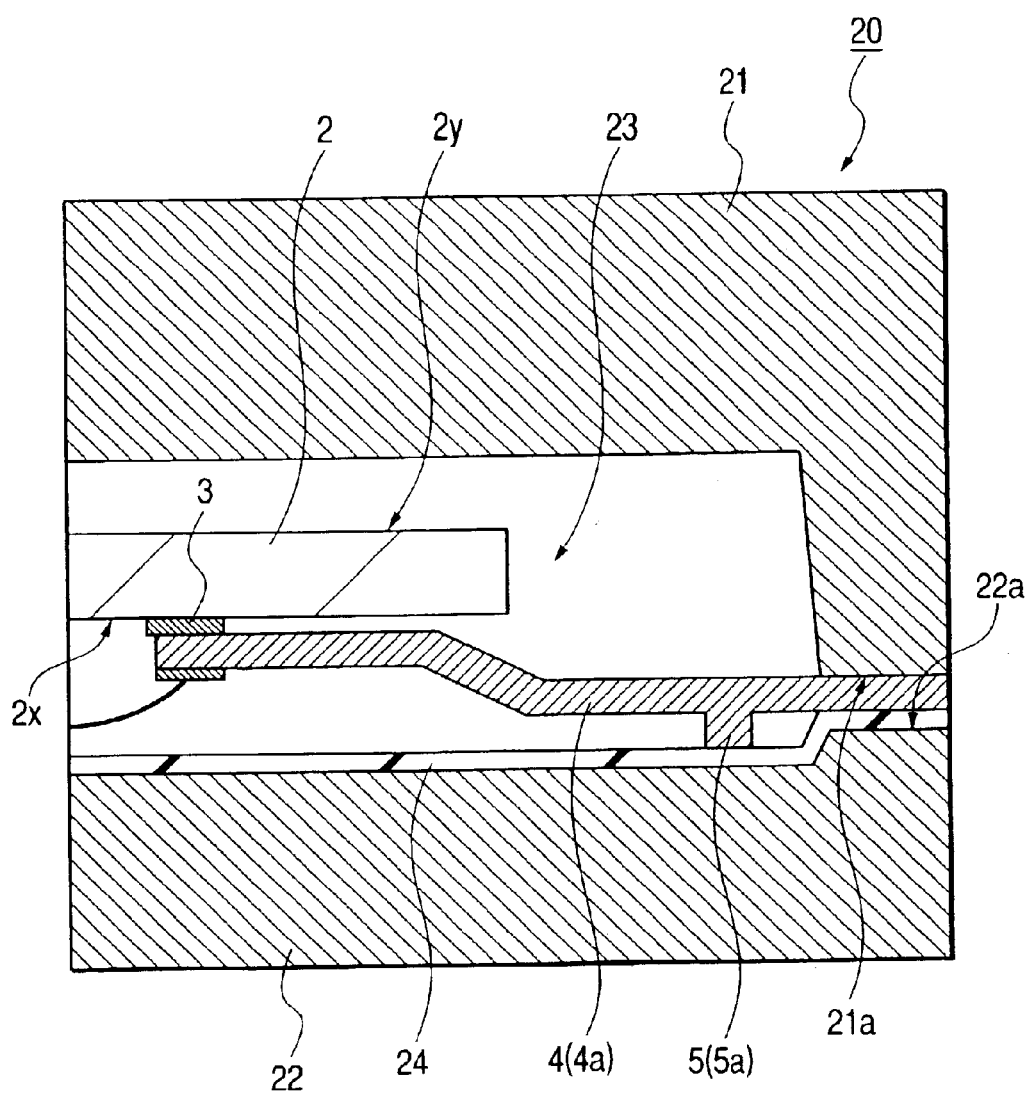
FIG. 12 is a partially enlarged sectional view of FIG. 11.
Figure 13:
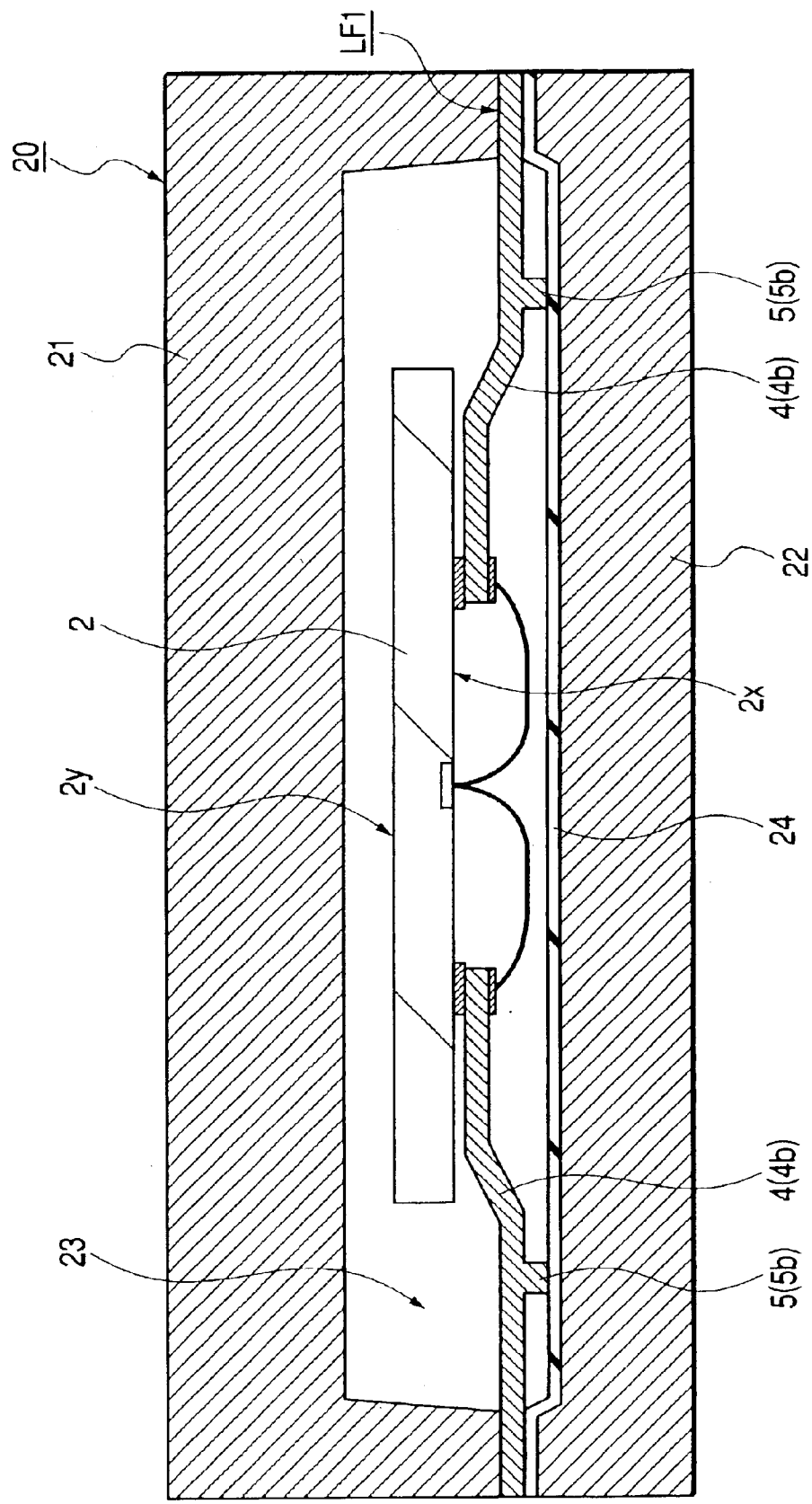
FIG. 13 is a sectional view taken along the second lead in the molding step included in the manufacturing process for the semiconductor device of the first embodiment.

FIG. 11 is a sectional view taken along first leads in a molding step included in a manufacturing process for the semiconductor device 1a;

FIG. 12 is a partially enlarged view of FIG. 11;

FIG. 13 is a sectional view taken along second leads in the molding step; and

Figure 14:
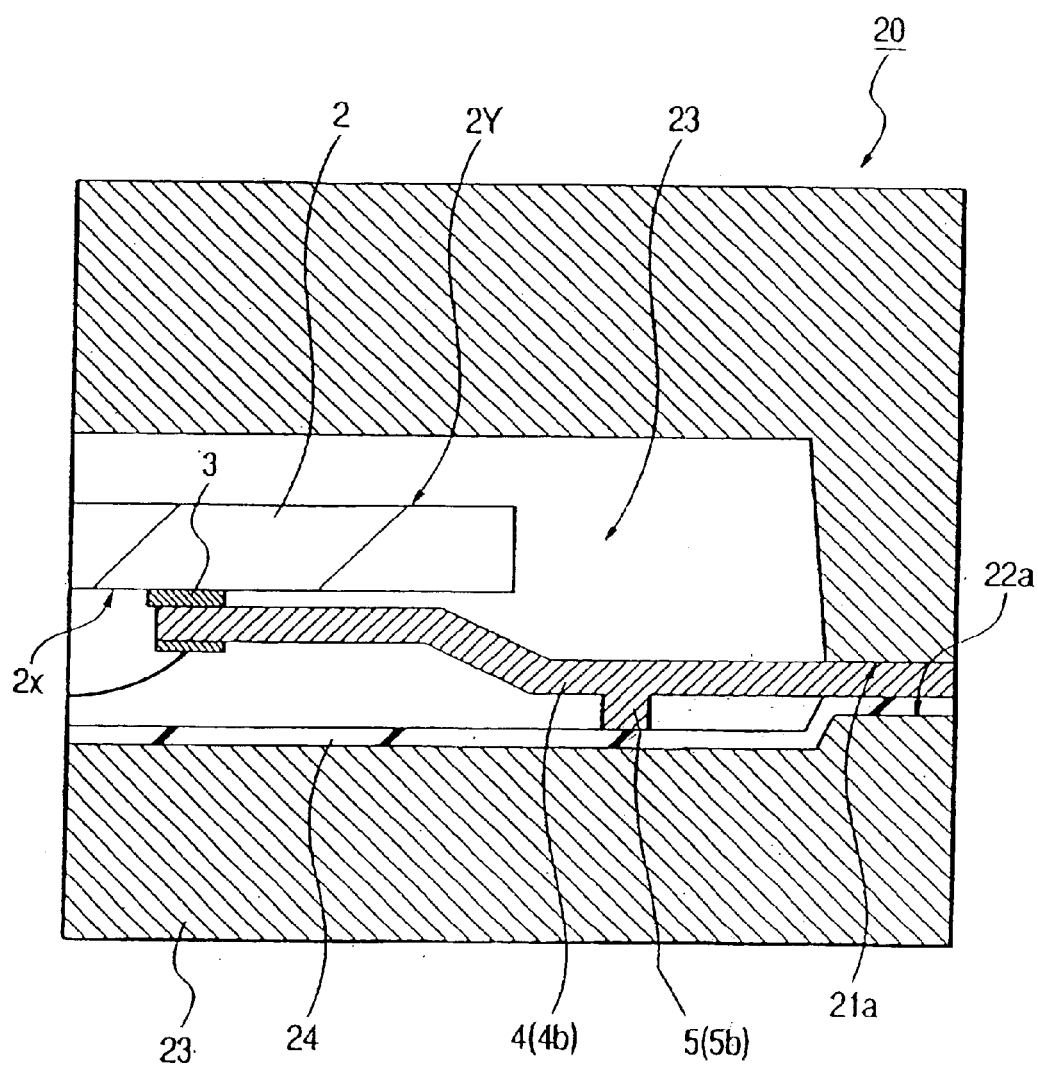
FIG. 14 is a partially enlarged sectional view of FIG. 13.

FIG. 14 is a partially enlarged sectional view of FIG. 13.

As shown in FIGS. 11 to 14, a molding die 20 includes an upper mold 21 and a lower mold 22 as vertically divided molds, further includes pot, cull, runner, resin injection gate, cavity 23, and air vents, although no limitation is made to this construction. The upper mold 21 is provided at a first mating surface with a first clamp portion 21a, a cavity 23 contiguous to the clamp portion 21a, a runner contiguous at one end to the cavity 23 through a resin injection gate, a cull contiguous to an opposite end of the runner, a pot contiguous to the cull, and air vents contiguous to the cavity. The lower mold 22 is provided at a second mating surface opposite to the first mating surface with a second clamp portion 22a opposite to the first clamp portion. The cavity 23 is recessed in the depth direction of the upper mold 21 from the first clamp portion 21a of the upper mold. A plane shape of the cavity 23 is quadrangular. It is rectangular in this embodiment.

According to the sheet molding technique, the resin sealing body is formed by the steps of positioning the lead frame LF1 between the upper mold 21 and the lower mold 22 of the molding die 20 so that a resin sheet (resin film) 24 is positioned between the lower mold 22 and the lead frame LF1 and thereafter injecting resin under pressure into the cavity 23 from the pot through the cull, runner and resin injection gate. In the sheet molding technique there is generally used a thermosetting resin and therefore a heat-resisting resin sheet capable of resisting the temperature adopted in forming the resin sealing body is used as the resin sheet 24. Besides, for attaining a stand-off package structure it is necessary that the external connections 5 of the leads 4 be allowed to bite into the resin sheet 24 with a clamping force of the molding die 20. Therefore, there is used a flexible resin sheet 24 capable of being crushed easily with the clamping force of the molding die 20.

Next, with reference to FIGS. 10(a) to 14, a description will be given below about manufacturing the semiconductor device 1a.

FIGS. 10(a) and 10(b) are sectional views showing manufacturing steps in a manufacturing process for the semiconductor device 1a, in which FIG. 10(a) is a sectional view in a die bonding step and FIG. 10(b) is a sectional view in a wire bonding step.

First, the lead frame LF1 shown in FIGS. 7 to 9(b) is provided and thereafter the semiconductor chip 2 is fixed to the lead frame LF1 as shown in FIG. 10(a). The fixing between the lead frame LF1 and the semiconductor chip 2 is done by fixing one end portions (the first portion 4 ml) of the leads to the main surface 2x of the semiconductor chip 2 through an insulating tape 3.

Next, as shown in FIG. 10(b), plural electrodes 2a arranged on the main surface 2x of the semiconductor chip 2 and plural leads 4 are electrically connected with each other through plural bonding wires 7. The bonding wires 7 are connected on one end side to the electrodes 2a of the semiconductor chip 2 and on an opposite end side to the plating layers 6 formed on the one end-side bonding faces of the leads 4.

Then, the molding die 20 shown in FIGS. 11 to 14 is provided. Subsequently, as shown in the same figures, the lead frame LF1 is positioned between the upper mold 21 and the lower mold 22 of the molding die 20.

The positioning of the lead frame LF1 is conducted with the resin sheet 24 interposed between the lead frame and the mating surface of the lower mold 22.

Moreover, the positioning of the lead frame LF1 is conducted with the semiconductor chip 2 and bonding wires 7 positioned in the interior of the cavity 23.

Further, the positioning of the lead frame LF1 is conducted in a state in which the opposite end portions of the leads (4a, 4b) 4 are sandwiched vertically by the first clamp portion 21a of the upper mold 21 and the second clamp portion 22a of the lower mold 22 and the external connections (5a, 5b) are put in contact with the resin sheet disposed between the leads (4a, 4b) 4 and the second mating surface of the lower mold 22.

Then, as noted earlier, with the lead frame LF1 positioned, a thermosetting resin for example is injected under pressure into the cavity 23 from the pot through the cull, runner and resin injection gate to form a resin sealing body 8. The semiconductor chip 2, plural leads 4 and plural bonding wires 7 are sealed with the resin sealing body 8.

In this step there is almost completed a stand-off package in which the external connections 5 are exposed and projected to the exterior from the back surface 8y of the resin sealing body 8.

Next, the resin sheet 24 affixed to the lead frame LF1 is peeled off, the lead frame LF1 is taken out from the molding die 20 and is then subjected to a curing step to accelerate curing of the resin sealing body 8, followed by going through a cutting step to separate the tie bars 12 and a cutting step to separate the leads 4 from the frame body 10, whereby the semiconductor device 1a of this embodiment is nearly completed.

In the molding step included in the manufacturing process for the semiconductor device of this embodiment, there is adopted a sheet molding technique in which the resin sheet 24 is disposed between the lead frame LF1 and the lower mold 22 of the molding die 20, and with the external connections 5 of the leads 4 put in contact with the resin sheet 24, the opposite end portions of the leads 4 are sandwiched vertically by the clamp portion 21a of the upper mold 21 and the clamp portion 22a of the lower mold 22. In such a constitution, the external connections 5 of the leads 4 press down the resin sheet 24 with the pressing force of the molding die 20 (upper mold 21 and lower mold 22), so that the tip ends of the external connections 5 bite into the resin sheet 24. Consequently, when the lead frame LF1 is taken out from the molding die 20 after the injection of resin into the cavity 23 to form the resin sealing body 8, the tip ends of the external connections 5 which have bitten into the resin sheet 24 project to the exterior from the back surface 8y of the resin sealing body 8.

Further, when the lead frame LF1 is pressed down with the clamping force of the molding die 20, by a spring force of a metal plate constituting the lead frame LF1, an upward force acts on one ends as tip ends of the leads 4. Therefore, in the case where the plural external connections 5 are arranged zigzag as in this embodiment, there occurs a difference in the pressing force of the external connections 5 against the resin sheet 24 between the leads 4 (4a) with external connections 5 (5a) positioned near the opposite end portions of the leads 4 and the leads 4 (4b) with external connections 5 (5b) positioned away from the opposite end portions of the leads 4. More particularly, the pressing force of the external connections 5b formed on the leads 4b against the resin sheet 24 becomes weaker than that of the external connections 5a formed on the leads 4a. As a result, the external connections 5b located farther than the external connections 5a from the clamp portion of the molding die 20 are deteriorated in their adhesion to the resin sheet 24 and there easily occurs such an inconvenience as the external connections 5b being covered with resin burr.

On the other hand, in this embodiment, the resin sealing is performed with one end portions of the leads 4 fixed to the main surface 2x of the semiconductor chip 2. Under such a condition, it is possible to prevent warping of the leads 4 which is caused by pressing down the lead frame LF1 with the clamping force of the molding die 20, and hence possible to suppress a lowering of the pressing force of the external connections 5b which presses down the resin sheet 24. Consequently, the external connections 5b remote from the clamp portion of the molding die 20 and the resin sheet 24 can be kept in close contact with each other, so that it is possible to suppress the occurrence of such an inconvenience as the external connections 5b being covered with resin burr. As a result, it is possible to improve the manufacturing yield of the semiconductor device 1a.

(Second Embodiment)

Figure 15A:
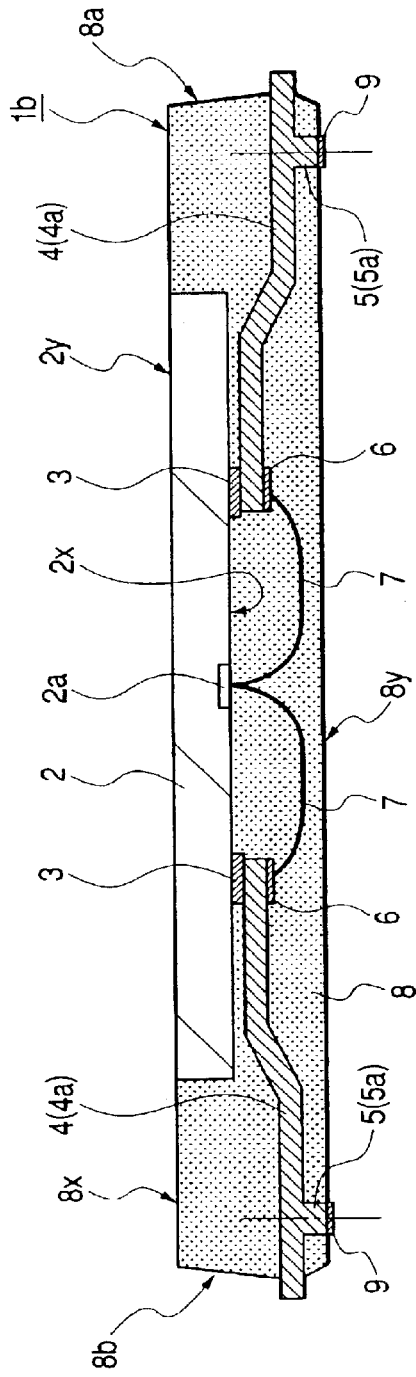
Figure 15B:
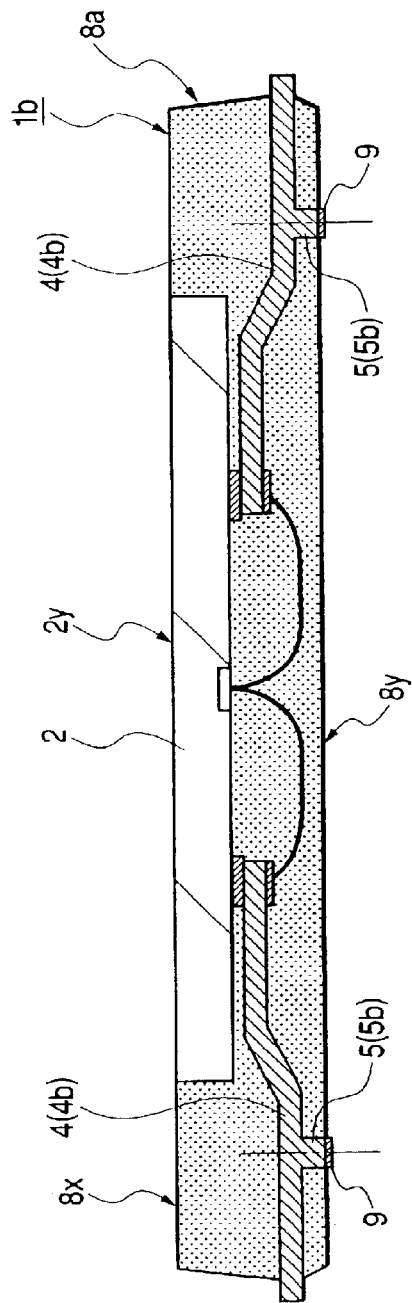
Figure 16:
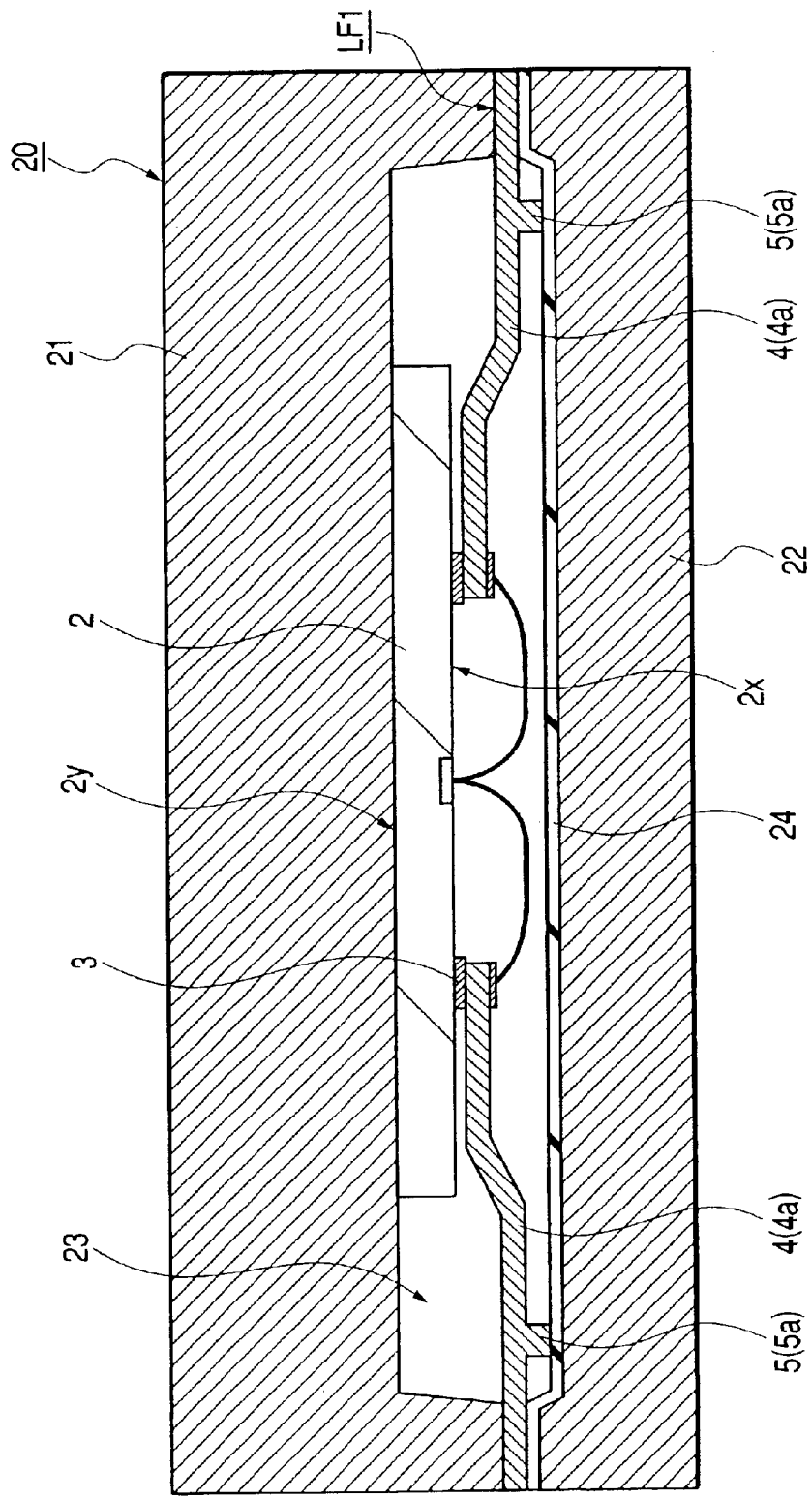
FIG. 16 is a sectional view taken along the first lead in a molding step included in a manufacturing process for the semiconductor device of the second embodiment.
Figure 17:
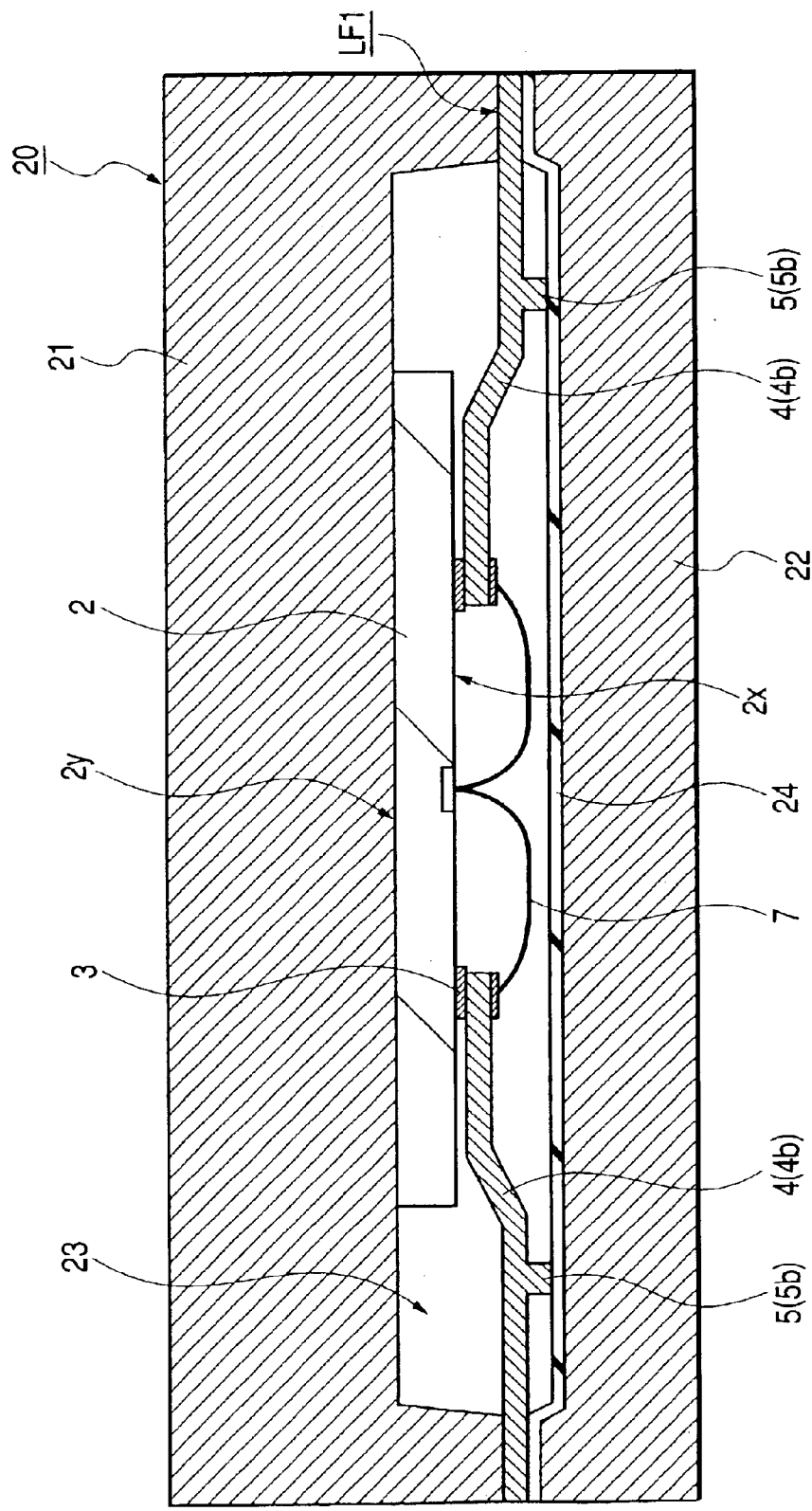
FIG. 17 is a sectional view taken along the second lead in the molding step included in the manufacturing process for the semiconductor device of the second embodiment.

FIGS. 15(a) and 15(b) are sectional views of a semiconductor device according to a second embodiment of the present invention, in which FIG. 15(a) is a sectional view taken along first leads and FIG. 15(b) is a sectional view taken along second leads;

FIG. 16 is a sectional view taken along the first leads in a molding step included in a manufacturing process for the semiconductor device of the second embodiment; and FIG. 17 is a sectional view taken along second leads in the molding step.

As shown in FIGS. 15(a) and 15(b), the semiconductor device of this second embodiment, indicated at 1b, is of basically the same construction as in the previous first embodiment except the following points.

Although the semiconductor device 1a of the first embodiment is of a package structure wherein the back surface 2y of the semiconductor chip 2 is covered with the resin of the resin sealing body 8, the semiconductor device 1b of this second embodiment is of a package structure wherein a back surface 2y of a semiconductor chip 2 is exposed from a main surface 8x of a resin sealing body 8, in other words, a package structure wherein the back surface 2y of the semiconductor chip 2 is not covered with the resin of the resin sealing body 8.

As shown in FIGS. 16 and 17, such a package structure is obtained by performing, in the molding step, the sealing with resin in a contacted state of the back surface 2y of the semiconductor chip 2 with an inner wall surface of a cavity 23 which confronts the back surface 2y.

Also in such a package structure there can be obtained the same effects as in the first embodiment.

In this embodiment, one end portions of the leads 4 are fixed to the main surface 2x of the semiconductor chip 2 and the back surface 2y of the semiconductor chip 2 is put in contact with the inner wall surface of the cavity 23, then in this state there is performed the sealing with resin. Accordingly, it is possible to further suppress warping of the leads which is caused by pressing down the lead frame LF1 with the clamping force of a molding die 20, and hence possible to further suppress the occurrence of such an inconvenience as the external connections 5b being covered with resin burr.

(Third Embodiment)

FIGS. 18(a) and 18(b) are sectional views of a semiconductor device according to a third embodiment of the present invention, in which FIG. 18(a) is a sectional view taken along first leads and FIG. 18(b) is a sectional view taken along second leads.

As shown in FIGS. 18(a) and 18(b), the semiconductor device of this third embodiment, indicated at 1c, is basically of the same construction as in the first embodiment except the following point.

Although the semiconductor device 1a of the first embodiment is of a package structure wherein the main surface 2x of the semiconductor chip 2 is positioned on the back surface 8y side of the resin sealing body 8, in other words, a package structure wherein the back surface 2y of the semiconductor chip 2 and the back surface 8y of the resin sealing body 8 are positioned on the same side, the semiconductor device of this third embodiment, indicated at 1b, is of a package structure wherein a back surface 2y of a semiconductor chip 2 is positioned on a back surface 8y side of a resin sealing body 8, in other words, a package structure wherein the back surface 2y of the semiconductor chip 2 and the back surface 8y of the resin sealing body 8 are positioned on the same side. Also in this semiconductor device 1c there can be obtained the same effects as in the first embodiment.

(Fourth Embodiment)

This fourth embodiment shows an example of application of the present invention to a semiconductor device in which two semiconductor chips are sealed with a single resin sealing body.

FIGS. 19(a), 19(b), 19(c), 20(a), 20(b) and 20(c) are sectional views showing manufacturing steps used in manufacturing the semiconductor device of this embodiment.

Figure 20A:
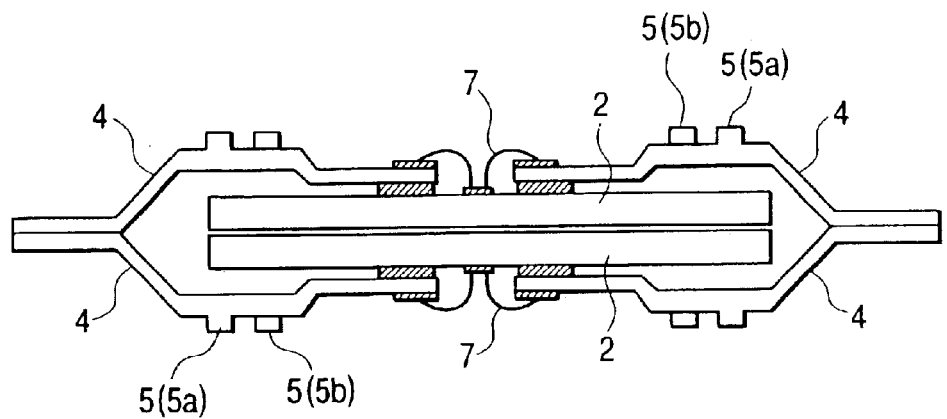
FIGS. 20(a), 20(b), and 20(c) are sectional views showing manufacturing steps included in the manufacturing process for the semiconductor device of the fourth embodiment.
Figure 20B:
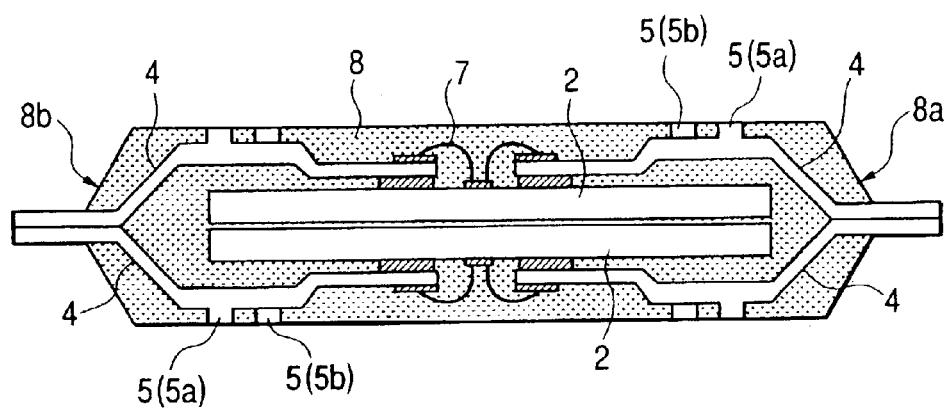
Figure 20C:
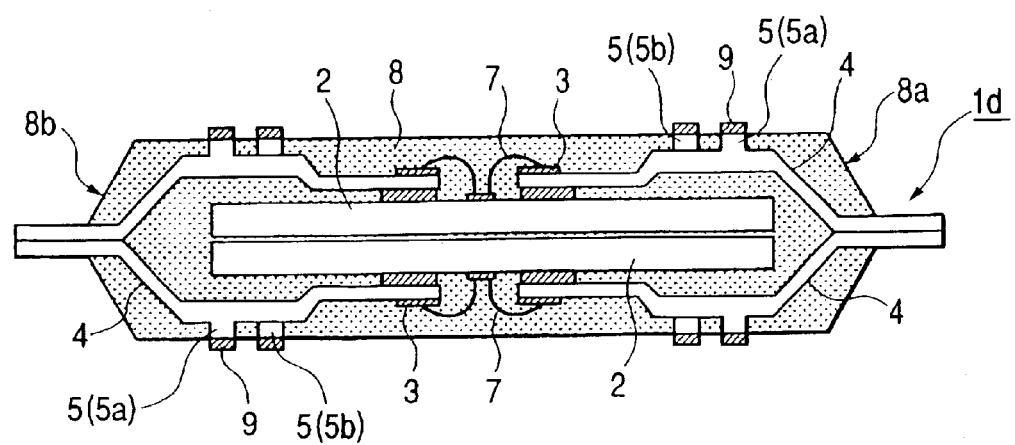

As shown in FIG. 20(c), the semiconductor device of this embodiment, indicated at 1d, is of a package structure in which two semiconductor chips 2 of the same structure are stacked so that the respective back surfaces confront each other, and are sealed with a resin sealing body 8. The semiconductor device 1d of this embodiment is fabricated by superimposing two lead frames having the same lead pattern one on the other and therefore an upper structure and a lower structure are approximately symmetric with mating surfaces of the two semiconductor chips as a boundary.

Plural leads 4 are arranged along one of two long sides of one semiconductor chip 2 (the upper one in the figure) of which long sides are positioned opposite to each other, and also along the other long side there are arranged plural leads 4. One end portions of the plural leads 4 arranged along one long side are fixed to a main surface of one semiconductor chip 2 through an insulating tape 3, while opposite end portions thereof are arranged near a side face 8a of a resin sealing body 8. One end portions of the plural leads 4 arranged along the other long side are fixed to the main surface of one semiconductor chip 2 through an insulating tape 3, while opposite end portions thereof are arranged near a side face 8b of the resin sealing body 8.

Likewise, plural leads 4 are arranged along one of two long sides of the other semiconductor chip 2 (the lower one in the figure) of which long sides are opposite to each other, and also along the other long side there are arranged plural leads 4. One end portions of the plural leads 4 arranged along one long side are fixed to a main surface of the other semiconductor chip 2 through an insulating tape 3, while opposite end portions thereof are arranged near the side face 8a of the resin sealing body 8. One end portions of the plural leads 4 arranged along the other long side are fixed to the main surface of the other semiconductor chip 2 through an insulating tape 3, while opposite end portions thereof are arranged near the side face 8b of the resin sealing member 8.

Plural external connections 5 are arranged on a main surface of the resin sealing body 8. Also on a back surface of the resin sealing body 8 are arranged plural external connections 5. These external connections 5 are arranged zigzag as in the first embodiment. Thus, with the main surface or the back surface of the resin sealing member 8 as a mounting surface, the semiconductor device 1d of this embodiment can be mounted on a wiring substrate. It is also possible to mount two same semiconductor devices 1d in a vertically stacked state.

The leads 4 used in this embodiment are different in shape from the leads 4 used in the first embodiment. More particularly, the leads 4 used in the first embodiment each have two bent portions, while the leads 4 used in this fourth embodiment each have four bent portions. The leads 4 used in this embodiment each have a first portion extending on the main surface of each semiconductor chip 2, a second portion bent from the first portion to a mounting surface (main surface or back surface) side of the resin sealing body 8, a third portion extending from the second portion toward a side face of the resin sealing body 8, a fourth portion which is bent from the third portion toward the semiconductor chip 2, and a fifth portion which is bent from the fourth portion toward the side face of the resin sealing body 8. As in the first embodiment, external connections 5 are each formed in the third portion.

The fifth portion of each of the upper lead 4 is connected electrically and mechanically to the fifth portion of the corresponding lower lead 4.

Next, with reference to FIGS. 19(a), 19(b), 19(c), 20(a), 20(b), and 20(c), a description will be given below about manufacturing the semiconductor device 1d.

Figure 19A:
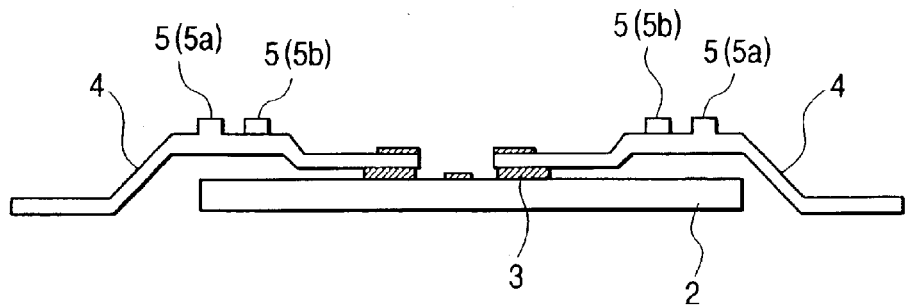
FIGS. 19(a), 19(b), and 19(c) are sectional views showing manufacturing steps included in a manufacturing process for a semiconductor device according to a fourth embodiment of the present invention.

First, two lead frames having the same lead pattern are provided and semiconductor chips 2 are fixed respectively to one and the other lead frame in such a manner that one end portions of the leads 4 are fixed to the main surface of each semiconductor chip through an insulating tape 3, as shown in FIG. 19(a).

Figure 19B:
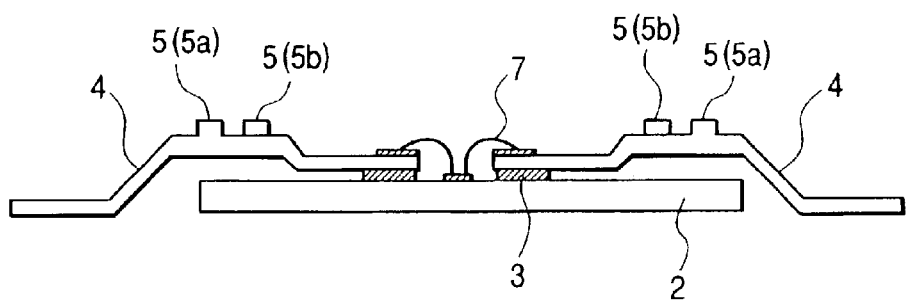

Then, as shown in FIG. 19(b), electrodes on the semiconductor chips 2 and the leads 4 are electrically connected with each other through bonding wires 7 at one and the other lead frame. The connection between the leads 4 of one lead frame and the electrodes on the associated semiconductor chip 2 is performed by reverse bonding in such a manner that the layout of wires 7 becomes reverse right and left with respect to the connection between the leads 4 of the other lead frame and the electrodes on the associated semiconductor chip 2.

Figure 19C:
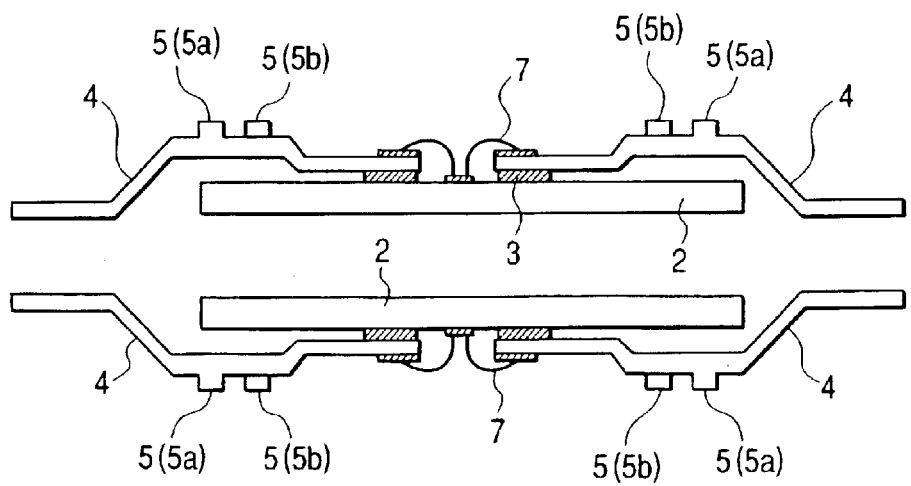

Next, as shown in FIGS. 19(c) and 20(a), the back surface of the semiconductor chip 2 on one lead frame and that of the semiconductor chip 2 on the other lead frame are set face to face with each other, then in this state both lead frames are superimposed one on the other, and thereafter the fifth portions of the leads 4 of one lead frame and the fifth portion of the leads 4 of the other lead frame are connected together electrically and mechanically. For this connection of the leads 4 there is used laser welding for example.

Subsequently, as shown in FIG. 20(b), the two semiconductor chips 2, leads 4 of both lead frames, and the bonding wires 7 are sealed with resin to form a resin sealing body 8. For forming the resin sealing body 8 there is used the same sheet molding technique as that used in the first embodiment. In this embodiment, however, the molding is carried out while interposing a resin sheet between a lower mold of a molding die and the lead frames and also between an upper mold of the molding dire and the lead frames. In this way there is formed a package wherein plural external connections 5 are arranged zigzag on both main surface and back surface of the resin sealing body 8.

Next, the resin sheets affixed to the lead frames are peeled off and the lead frames are taken out from the molding die, thereafter, as shown in FIG. 20(c), a solder layer 9 is formed on the projecting end of each of the external connections 5 exposed from the resin sealing body 8, followed by a curing step for accelerating the curing of the resin sealing body 8, further followed by a cutting step for separating tie bars from the two lead frames and a cutting step for separating the leads 4 from the frame bodies, whereby the semiconductor device 1d of this embodiment is nearly completed.

Thus, since the semiconductor device 1d of this embodiment has such a package structure as two semiconductor chips 2 are sealed with a single resin sealing body 8, it is possible to effect a high density packaging.

Further, in the package structure of the semiconductor device 1d of this embodiment, since the external connections 5 are arranged zigzag on both main surface and back surface of the resin sealing body 8, the semiconductor device can be mounted on a wiring substrate using the main surface or the back surface of the resin sealing body 8 as a mounting surface. Additionally, since two same semiconductor devices 1d can be mounted in a vertically stacked state, it is possible to effect packaging in a still higher density.

(Fifth Embodiment)

This fifth embodiment shows an example in which a semiconductor device having two stacked semiconductor chips is fabricated by a through molding method.

FIGS. 21(a) to 23(b) are sectional views showing manufacturing steps used in manufacturing the semiconductor device of this fifth embodiment.

First, two lead frames of a multi-frame structure having the same lead pattern are provided and are then subjected to die bonding and wire bonding in the same way as in the fourth embodiment. Thereafter, as shown in FIG. 21(a), a semiconductor chip 2 on one lead frame and a semiconductor chip 2 on the other lead frame are set face to face with each other and in this state both lead frames are superimposed one on the other.

Then, as shown in FIG. 21(b), a resin sheet 24 is interposed between the two superimposed lead frames and an upper mold 31 of a molding die 30 and also between the two superimposed lead frames and a lower mold 32 of the molding die 30, and the two superimposed lead frames are positioned between the upper mold 31 and the lower mold 32 of the molding die 30. In this embodiment, the two lead frames are each formed with plural product-forming areas in a matrix shape. Therefore, also in the molding die 30 there are formed plural cavities 33 in a matrix shape correspondingly to the product-forming areas. In the molding die 30, a resin injection gate 34 is provided for each row of plural cavities and is connected to the first-stage cavity 33 in each row. Adjacent cavities 33 in each row are interconnected through a through gate 35 (see FIG. 22(a)).

Next, resin is injected into the cavity 33 from a pot of the molding die 30 through a runner and the resin injection gate 34 to seal the two semiconductor chips 2, one and the other lead frame 4 and the bonding wires 7 with the resin, thereby forming a resin sealing body 8.

Then, as shown in FIG. 22(b), the two lead frames are taken out from the molding die 30 and thereafter the fifth portions of the leads 4 of one lead frame and those of the of the other lead frame are connected together electrically and mechanically by laser welding for example.

Then, as shown in FIG. 23(a), a solder layer 9 is formed on the projecting end of each of external projections 5 exposed from the resin sealing body 8, followed by a curing step for accelerating the curing of the resin sealing body 8, further followed by a cutting step for separating tie bars from the two lead frames and a cutting step for separating the leads 4 from the frame bodies, whereby the semiconductor device 1e of this embodiment shown in FIG. 23(b) is nearly completed.

Thus, also in this embodiment there can be obtained the same effects as in the previous fourth embodiment.
(Sixth Embodiment)

This sixth embodiment shows an example in which a semiconductor device having two semiconductor chips in a stacked state is fabricated by a block molding method.

Figure 26:
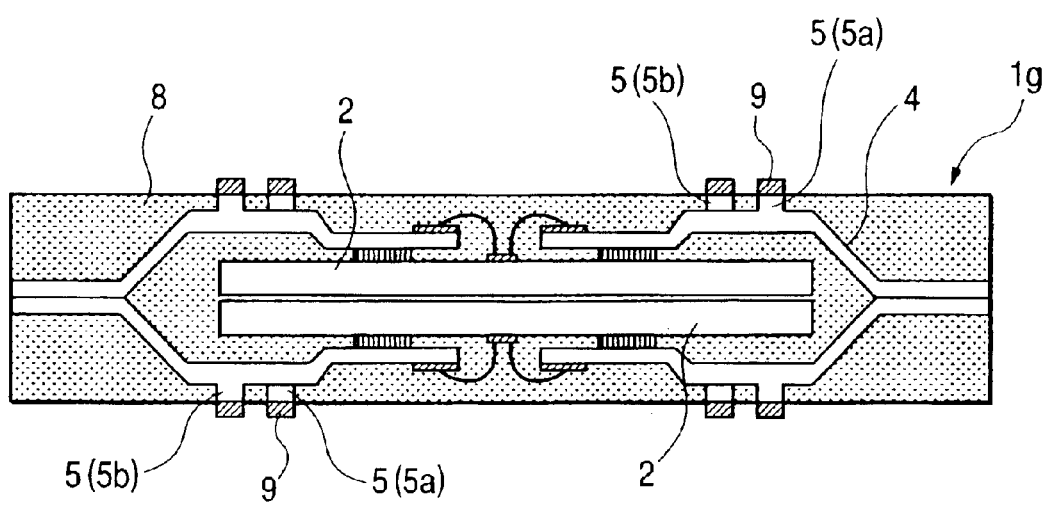
FIG. 26 is a sectional view showing an internal structure of the semiconductor device of the sixth embodiment.

FIGS. 24(a) to 25(c) are sectional views showing manufacturing steps used in manufacturing the semiconductor device of this embodiment; and FIG. 26 is a sectional view showing an internal structure of the semiconductor device of this embodiment.

In the semiconductor device of this sixth embodiment, indicated at 1g, a plane size of a main surface and that of a back surface of a resin sealing body 8 are approximately the same, and side faces of the resin sealing body 8 are substantially perpendicular to both main surface and back surface of the resin sealing body. For manufacturing the semiconductor device 1g of this embodiment there is adopted a block molding method. That is, although the details will be described later, the semiconductor device 1g is fabricated by sealing semiconductor chips formed respectively on plural product-forming areas of lead frames all together with a single resin sealing body and thereafter dividing the lead frames and the resin sealing body into each product-forming area.

With reference to FIGS. 24(a) to 25(c), the following description is now provided about manufacturing the semiconductor device 1g of this embodiment.

First, two lead frames of a multi-frame structure having the same lead pattern are provided, followed by die bonding and wire bonding in the same way as in the fourth embodiment. Thereafter, as shown in FIG. 24(a), the lead frames are disposed so that a back surface of a semiconductor chip 2 on one lead frame and that of a semiconductor chip 2 on the other lead frame confront each other, and in this state both lead frames superimposed one on the other. At this time, using solder or an electrically conductive bonding material, the fifth portions of leads 4 of one lead frame and those of leads of the other lead frame are connected together electrically and mechanically.

Next, as shown in FIG. 24(b), a resin sheet 24 is interposed between the two superimposed lead frames and an upper mold 41 of a molding die 40 and also between the two superimposed lead frames and a lower mold 42 of the molding die 40, and the two superimposed lead frames are positioned between the upper mold 41 and the lower mold 42 of the molding die 40. The two lead frames used in this embodiment are each formed with plural product-forming areas in a matrix shape. The molding die 40 used in this embodiment is provided with a cavity 43 in which the plural product-forming areas of the lead frames can be arranged all together.

Then, resin is injected under pressure into the cavity 43 from a pot of the molding die 40 through a runner and a resin injection gate 44 to seal the two semiconductor chips 2, the leads 4 of both lead frames and bonding wires 7 with the resin, thereby forming a resin sealing body 8, as shown in FIG. 25(a).

Next, the two lead frames are taken out from the molding die 40 and thereafter a solder layer 9 is formed on a projecting end of each of external connections 5 exposed from the resin sealing body. Subsequently, as shown in FIG. 25(c), the two lead frames and the resin sealing body 8 are divided into each product-forming area, whereby the semiconductor device 1g of this embodiment is substantially completed.

Thus, also in this embodiment there can be obtained the same effects as in the fourth embodiment.
(Seventh Embodiment)

Figure 27:
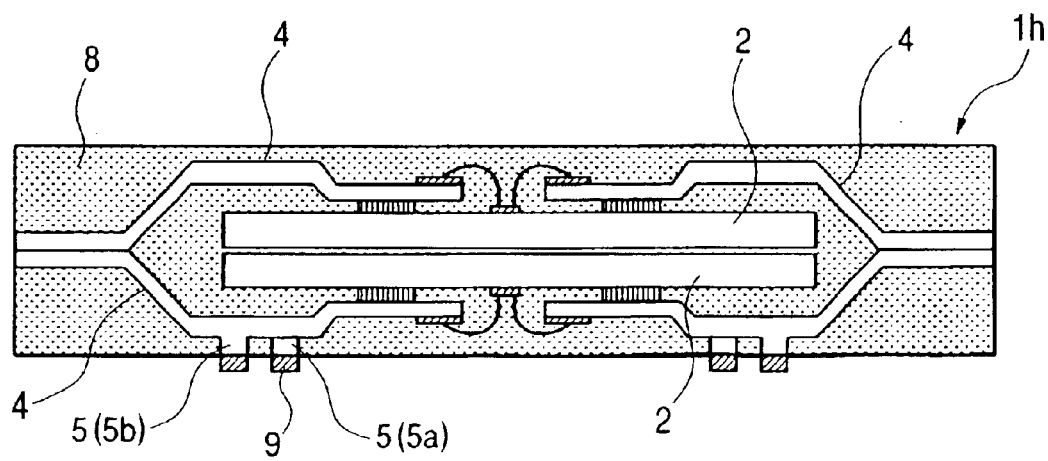
FIG. 27 is a sectional view showing an internal structure of a semiconductor device according to a seventh embodiment of the present invention.

FIG. 27 is a sectional view showing an internal structure of a semiconductor device according to a seventh embodiment of the present invention.

As shown in FIG. 27, the semiconductor device of this embodiment, indicated at 1h, is of basically the same construction as the previous sixth embodiment except the following point.

Although the semiconductor device 1g of the previous sixth embodiment has a package structure wherein plural external connections 5 are arranged zigzag on both main surface and back surface of the resin sealing body 8, the semiconductor device 1h of this seventh embodiment is of a package structure wherein plural external connections are arranged zigzag on only the back side of the resin sealing body 8. The semiconductor device 1h of such a package structure is fabricated by a block molding method using, as one of two lead frames, a lead frame not having external connections 5 on leads 4. Also with the semiconductor device 1h of this seventh embodiment there can be obtained the same effects as in the first embodiment.
(Eighth Embodiment)

Figure 28:
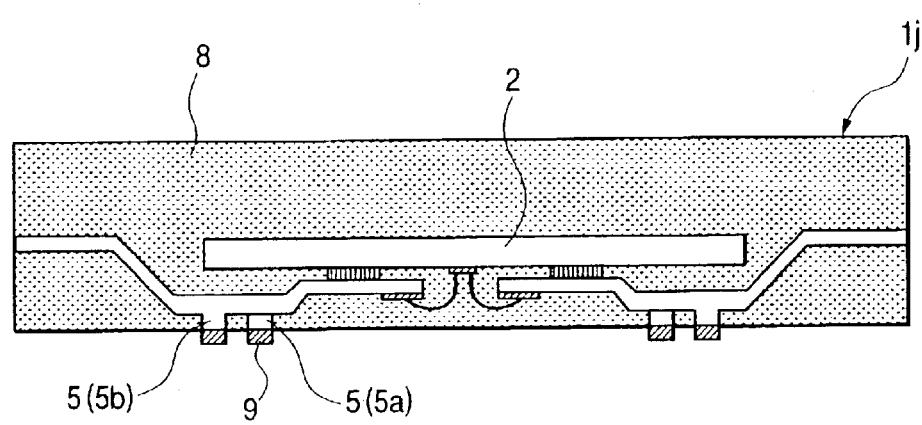
FIG. 28 is a sectional view showing an internal structure of a semiconductor device according to an eighth embodiment of the present invention.

FIG. 28 is a sectional view showing an internal structure of a semiconductor device according to an eighth embodiment of the present invention.

The semiconductor device 1j of this embodiment is of a package structure wherein one semiconductor chip 2 is sealed with one resin sealing body 8. It is fabricated by a block molding method using one lead frame. Also with the semiconductor device 1j of this eighth embodiment there can be obtained the same effects as in the first embodiment.
(Ninth Embodiment)

Figure 29:
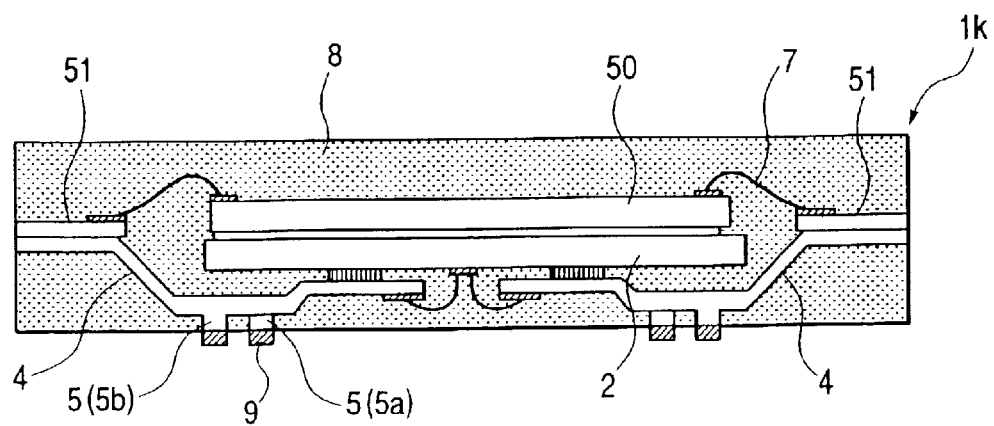
FIG. 29 is a sectional view showing an internal structure of a semiconductor device according to a ninth embodiment of the present invention.

FIG. 29 is a sectional view showing an internal structure of a semiconductor device according to a ninth embodiment of the present invention.

The semiconductor device of this ninth embodiment, indicated at 1k, has a package structure wherein two semiconductor chips (2, 50) of different structures are stacked in such a manner that the respective back surfaces confront each other, and are sealed with one resin sealing body 8. According to this package structure, plural external connections 5 are arranged zigzag on only the back surface of the resin sealing body 8. Electrodes on the semiconductor chip 50 are electrically connected to leads different in shape from the leads 4 through bonding wires, the leads 51 being connected to the fifth portions of the leads 4 electrically and mechanically. Also in this embodiment there can be attained a high density packaging.
(Tenth Embodiment)

Figure 30:
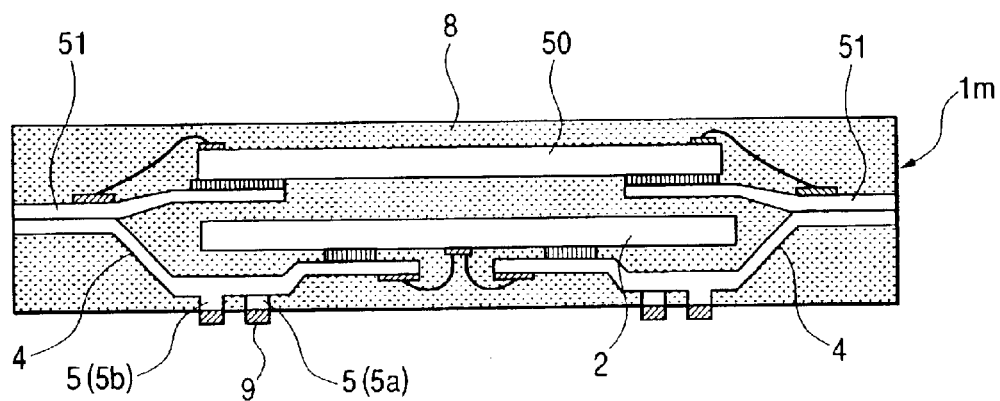
FIG. 30 is a sectional view showing an internal structure of a semiconductor device according to a tenth embodiment of the present invention.

FIG. 30 is a sectional view showing an internal structure of a semiconductor device according to a tenth embodiment of the present invention.

As shown in FIG. 30, the semiconductor device of this tenth embodiment, indicated at 1m, is of basically the same construction as the previous ninth embodiment except the following point.

A semiconductor chip 50 is bonded through an insulating adhesive to leads 51 which are extended between the semiconductor chip 50 and a semiconductor chip 2. Also in this embodiment it is possible to attain a high density packaging.
(Eleventh Embodiment)

Figure 31:
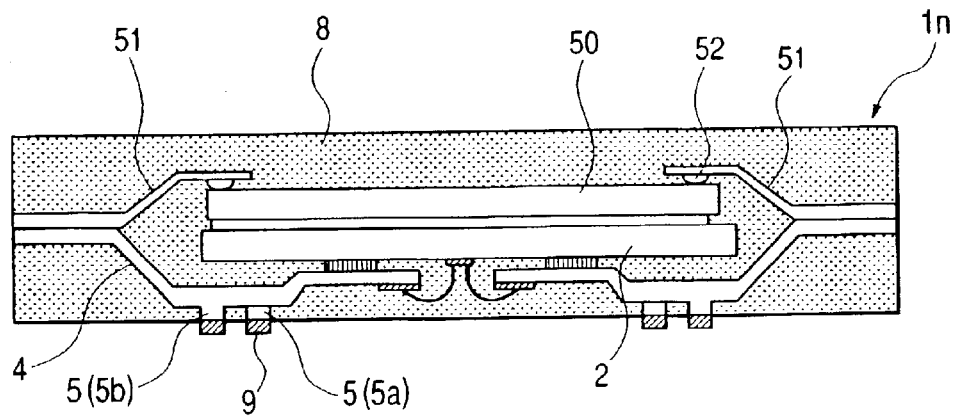
FIG. 31 is a sectional view showing an internal structure of a semiconductor device according to an eleventh embodiment of the present invention.

FIG. 31 is a sectional view showing an internal structure of a semiconductor device according to an eleventh embodiment of the present invention.

As shown in FIG. 31, the semiconductor device of this eleventh embodiment, indicated at 1n, is of basically the same construction as the ninth embodiment except the following construction.

Electrodes formed on a main surface of a semiconductor chip 50 and leads 51 are connected together electrically and mechanically through conductive bumps 52 interposed therebetween. Also in this embodiment it is possible to attain a high density packaging.
(Twelfth Embodiment)

Figure 32:
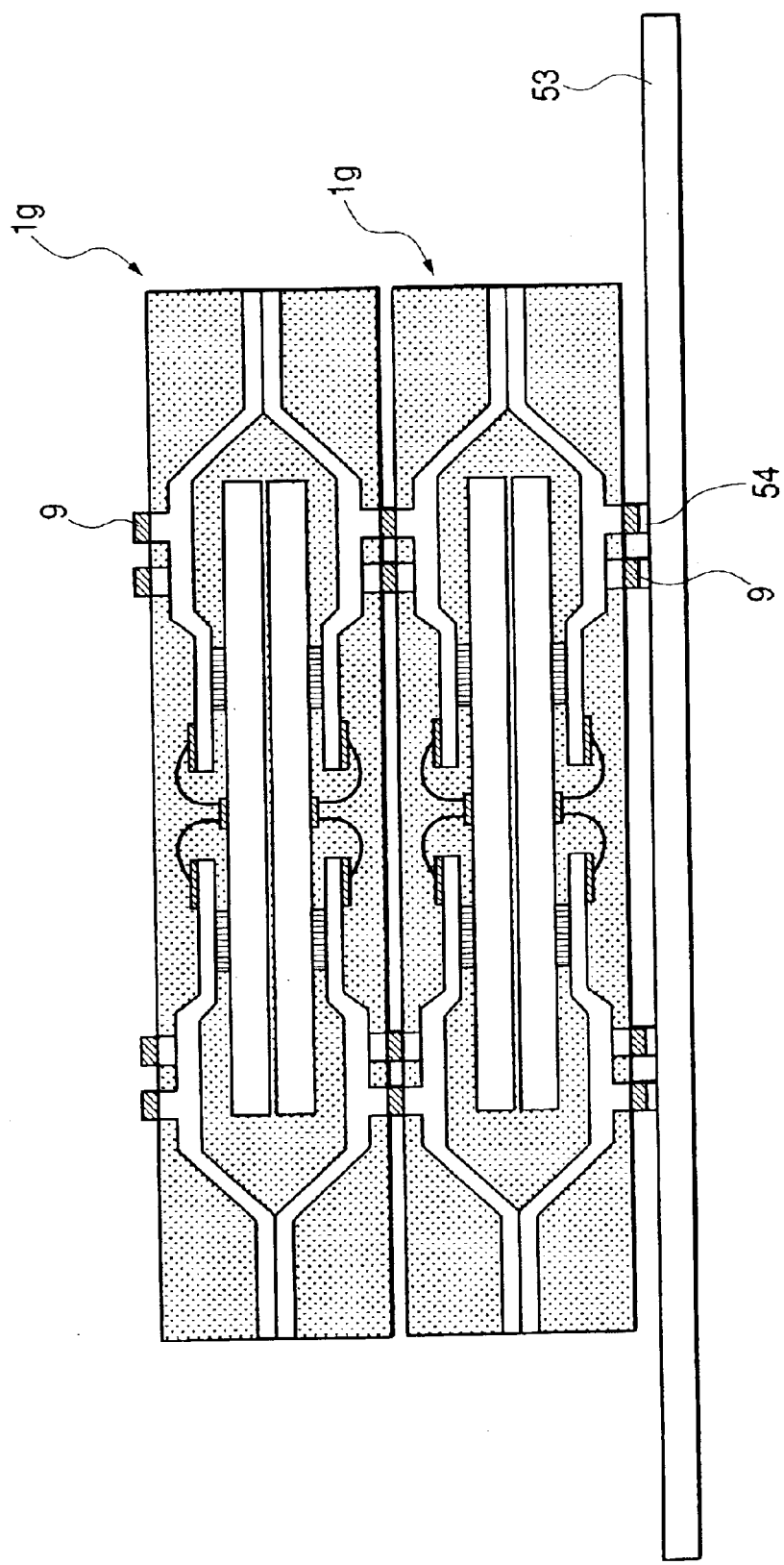
FIG. 32 is a sectional view showing a schematic construction of a module according to a twelfth embodiment of the present invention.
Figure 33:
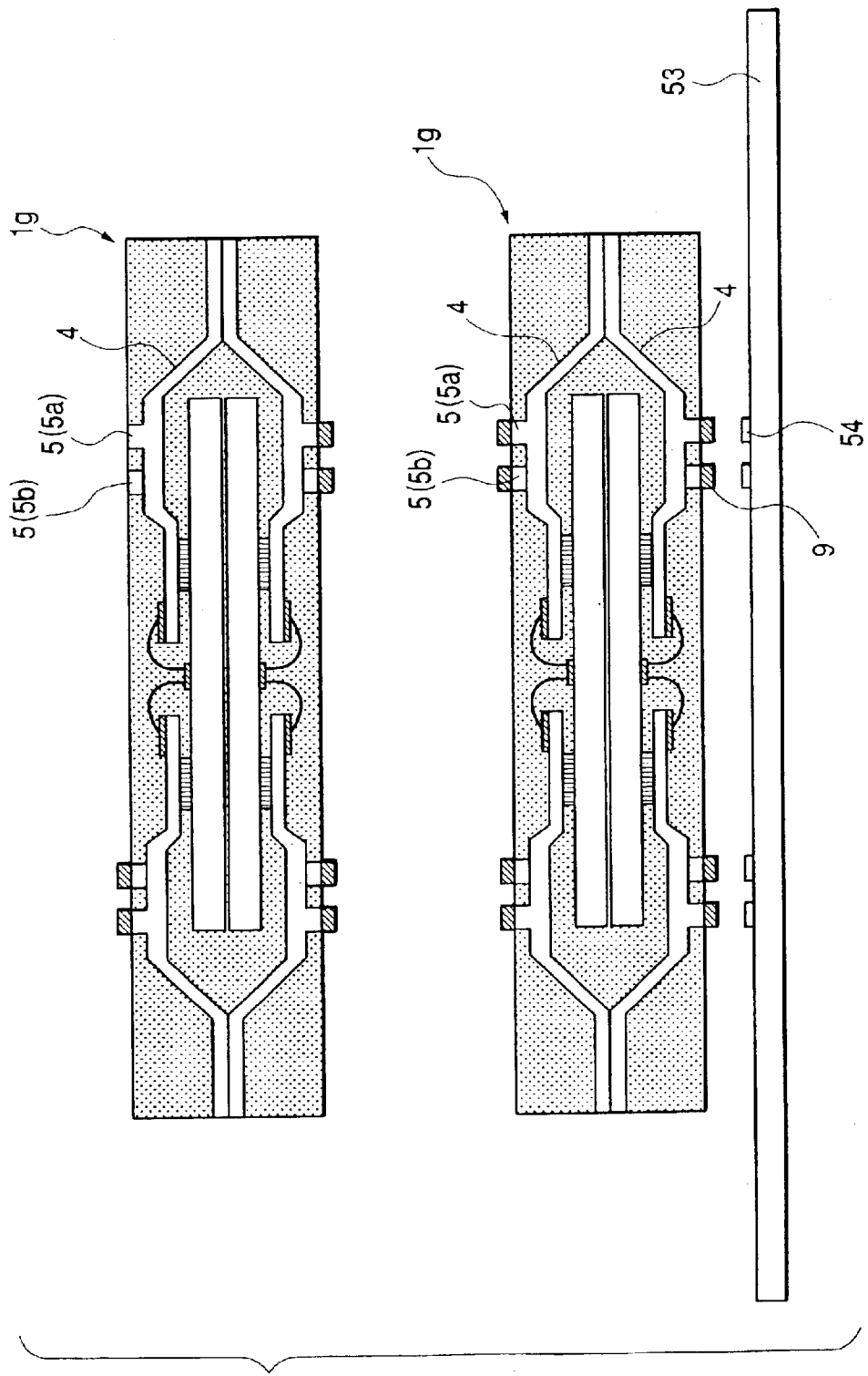
FIG. 33 is a sectional view showing a first semiconductor device mounting method in fabricating the module of the twelfth embodiment.
Figure 34:
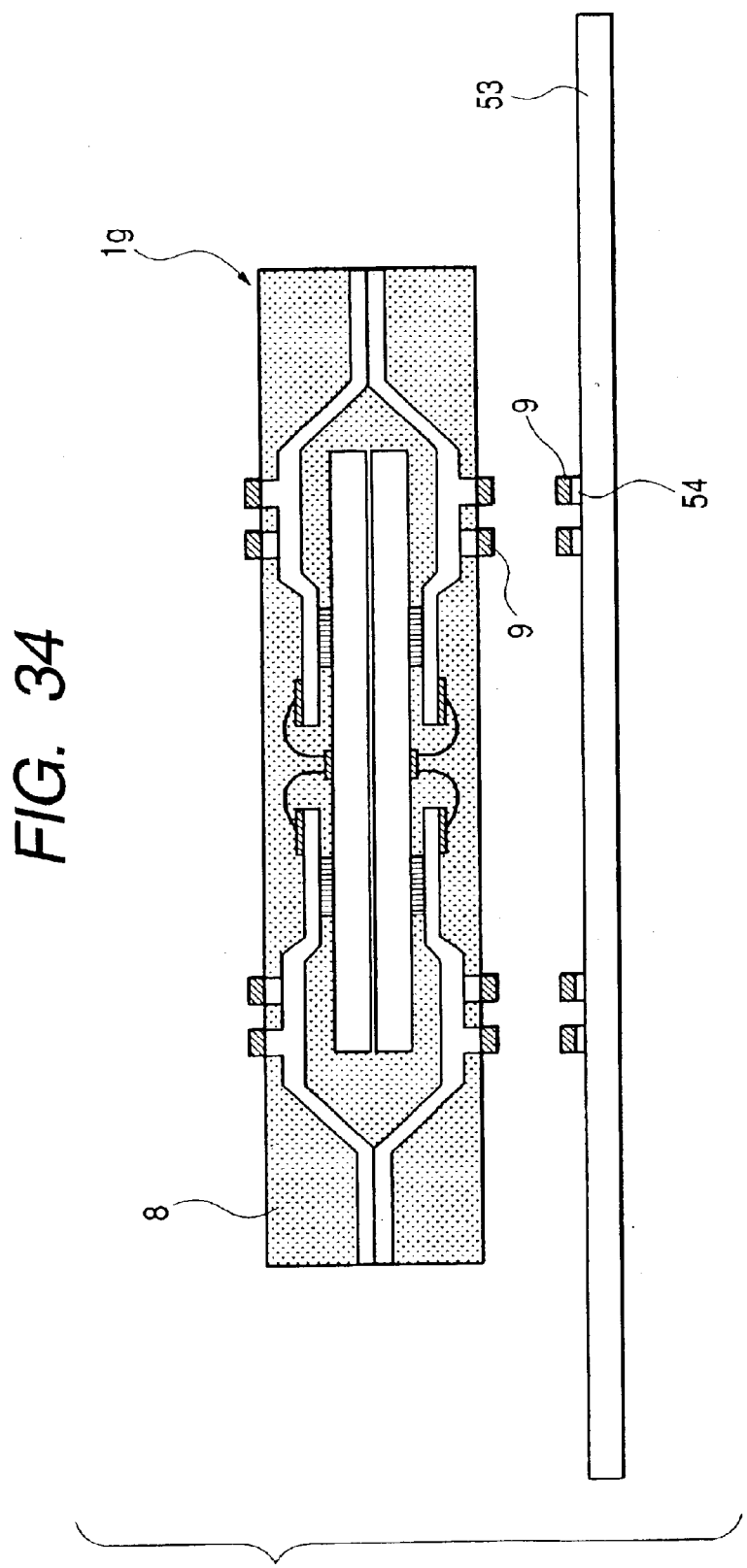
FIG. 34 is a sectional view showing a second semiconductor device mounting method in fabricating the module of the twelfth embodiment.
Figure 35:
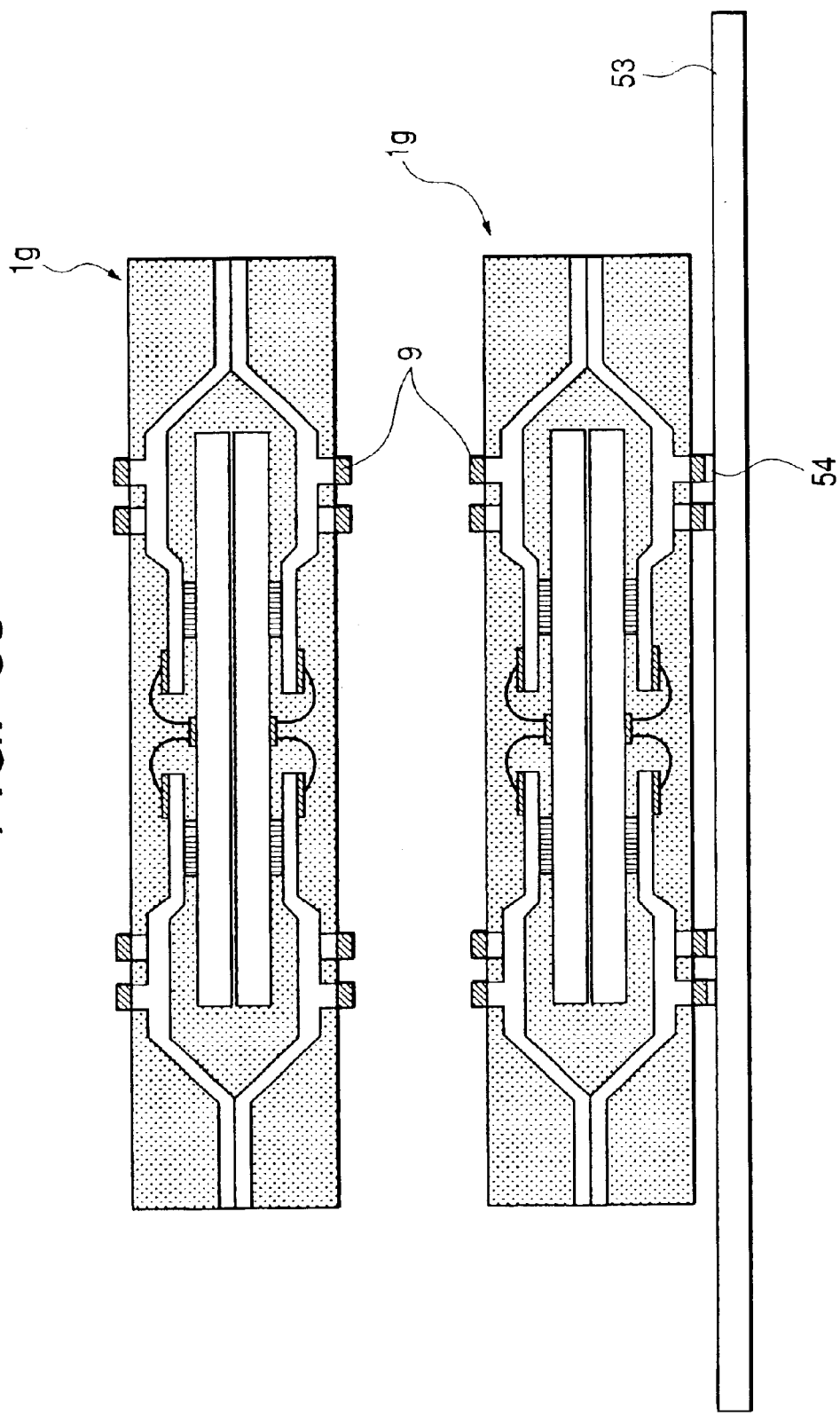
FIG. 35 is a sectional view showing the second semiconductor device mounting method in fabricating the module of the twelfth embodiment.

FIG. 32 is a sectional view showing a schematic construction of a module according to a twelfth embodiment of the present invention;

FIG. 33 is a sectional view showing a first semiconductor device mounting method which may be adopted in manufacturing the module of this embodiment; and FIGS. 34 and 35 are sectional views showing a second semiconductor device mounting method which may be adopted in manufacturing the module of this embodiment.

In the module (electronic device) of this embodiment, two semiconductor devices 1g are mounted on a wiring substrate 53 in a vertically stacked state of two semiconductor devices 1g. In the lower semiconductor device 1g, external connections 5 formed on a back surface of a resin sealing body 8 are connected to electrodes 54 on the wiring substrate 53 electrically and mechanically each through a solder layer 9, and external connections 5 formed on a main surface of the resin sealing body 8 are connected electrically and mechanically each through a solder layer 9 to external connections 5 formed on a back surface of a resin sealing body 8 in the upper semiconductor device 1g.

The two semiconductor devices 1g are mounted in fabricating the module. The following two methods are available as mounting methods for the two semiconductor devices 1g.
<First Mounting Method>

As shown in FIG. 33, the two semiconductor devices 1g are stacked vertically on the wiring substrate 53 and thereafter the solder layers 9 are melted to mount the semiconductor devices. In this case, as the solder layers 9 formed on the back and main surface of the lower semiconductor device 1g and the solder layers 9 formed on the back of the upper semiconductor device 1g there are used materials having the same melting point.
<Second Mounting Method>

The lower semiconductor device 1g is first mounted as in FIG. 34 and then the upper semiconductor device 1g is mounted on the lower semiconductor device 1g as in FIG. 35. In this case, as the material of the solder layers 9 formed on the main surface of the lower semiconductor device 1g and the back surface of the upper semiconductor device 1g there is used a higher melting material than the material of the solder layers 9 formed on the back surface of the lower semiconductor device 1g.

Thus, each semiconductor device 1g is of a package structure wherein plural external connections 5 are arranged zigzag on the main surface and back surface of the resin sealing body 8, and therefore two same semiconductor devices 1g can be mounted in a vertically stacked state, thus making it possible to attain a high density packaging of the module.

Thus in this embodiment reference has been made to an example of stacking two same semiconductor devices 1g. In this case, the semiconductor device 1h shown in FIG. 27 or the semiconductor device 1j shown in FIG. 28 may be used as the upper semiconductor device.

Although the present invention has been described above concretely by way of embodiments thereof, it goes without saying that the invention is not limited to the above embodiments and that various changes may be made within the scope not departing from the gist of the invention.

The following is a brief description of an effect obtained by typical modes of the present invention as disclosed herein.

According to the present invention it is possible to improve the manufacturing yield of a semiconductor device suitable for a multi-pin structure.

What is claimed is:

1. A method of manufacturing a semiconductor device, comprising the steps of:

providing a lead frame, the lead frame having first leads and second leads arranged adjacent to first leads side-by-side, each lead having first and second end portions, first external connections being formed on the first leads and second external connections being formed on the second leads and positioned on one end side of the leads with respect to the first external connections, and providing a molding die having a first mold and a second mold, the first mold having on a first mating surface a first clamp portion and a cavity contiguous to the first clamp portion, the second mold having a second clamp portion opposed to the first clamp portion on a second mating surface opposed to the first mating surface;

fixing first end portions of the first and second leads to a semiconductor chip;

connecting a plurality of electrodes arranged on a main surface of the semiconductor chip electrically to first end portions of the first and second leads respectively; and sandwiching second end portions of the first and second leads between the first and second clamp portions and injecting resin into the cavity after the first and second external connections are placed in contact with a resin sheet disposed between the second end portions of the first and second leads and the second mating surface, to seal the semiconductor chip and the first and second leads with the resin.

2. A method according to claim 1,
wherein first end portions of the first and second leads are fixed to the main surface of the semiconductor chip.

3. A method according to claim 1,
wherein the first and second leads extend across an outer periphery edge of the semiconductor chip, and
wherein the first and second external connections are formed on the first and second leads respectively at positions outside the semiconductor chip.

4. A method according to claim 1,
wherein the first and second leads each comprise a first portion extending on the main surface of the semiconductor chip, a second portion which is bent from the first portion to the second mating surface side, and a third portion extending from the second portion toward the first and second clamp portions, and the first and second external connections are formed respectively on the third portions of the first and second leads.

5. A method according to claim 4,
wherein the first portions of the first and second leads are fixed to the main surface of the semiconductor chip.

6. A method according to claim 1,
wherein the main surface of the semiconductor chip confronts the resin sheet.

7. A method according to claim 1,
wherein a back surface opposite to the main surface of the semiconductor chip is in contact with an inner wall surface of the cavity.

8. A method according to claim 1,
wherein a back surface opposite to the main surface of the semiconductor chip confronts the resin sheet.

9. A method according to claim 4,
wherein the width of each of the first and second external connections is larger than the width of the third portion of each of the first and second leads.

10. A method according to claim 1,
wherein the thickness of each of the first and second external connections is larger than the thickness of each of the first and second leads.

11. A method according to claim 1,
wherein the electrical connection between the electrodes on the semiconductor chip and the first and second leads is carried out using bonding wires.

12. A method according to claim 1,
wherein a plane shape of the semiconductor chip intersecting its thickness direction is quadrangular, and
wherein the plural electrodes are arranged centrally along one of two center lines on the main surface of the semiconductor chip.

13. A method according to claim 1, wherein the first and second leads are fixed to the semiconductor chip through an insulating tape.

14. A method of manufacturing a semiconductor device, comprising the steps of:

(a) providing a lead frame having a first lead and a second lead, and a semiconductor chip having a plurality of electrodes arranged on a main surface thereof, each of said first and second leads having a first end portion and a second end portion, the second end portion of each of the first and second leads providing an external connection;

(b) attaching the semiconductor chip to the lead frame such that the first end portions of the first and second leads are fixed to the main surface of the semiconductor chip;

(c) after the step (b), disposing the lead frame with the semiconductor chip in a molding die having an upper die and a lower die in such a manner that the semiconductor chip and the first end portions of said first and second leads are disposed in a cavity defined by the upper and lower dies of the molding die and the lead frame is clamped between the upper and lower dies of said molding die in the vicinity of the second end portions of the first and second leads, and in such a manner that a portion of a bottom surface of the second end portions of the first and second leads is adjacent to an inner surface of the lower die;

(d) then injecting a resin member into the cavity of the molding die by a transfer molding, thereby to form a resin sealing body to seal said semiconductor chip and the first end portions of the first and second leads, the portion of the bottom surface of the second end portions of the first and second leads being exposed from a lower surface of the resin.

15. A method of manufacturing a semiconductor device according to claim 14, further comprising the step of electrically connecting the first end portions of the first and second leads with the plurality of electrodes of the semiconductor chip by bonding wires, between the step (b) and the step (c).

16. A method of manufacturing a semiconductor device according to claim 14, wherein the second end portion of each of the first and second leads is disposed outside of the semiconductor chip.

* * * * *